(12) United States Patent
Jung et al.

(10) Patent No.: US 9,373,635 B2
(45) Date of Patent: Jun. 21, 2016

(54) SEMICONDUCTOR MEMORY DEVICES AND METHODS OF FABRICATING THE SAME

(71) Applicants: Won-Seok Jung, Anyang-si (KR); Youngok Kim, Suwon-si (KR); Jihye Kim, Anyang-si (KR); Kyungjoong Joo, Suwon-si (KR)

(72) Inventors: Won-Seok Jung, Anyang-si (KR); Youngok Kim, Suwon-si (KR); Jihye Kim, Anyang-si (KR); Kyungjoong Joo, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/801,430

(22) Filed: Jul. 16, 2015

(65) Prior Publication Data

US 2016/0104719 A1    Apr. 14, 2016

(30) Foreign Application Priority Data

Oct. 14, 2014  (KR) .................. 10-2014-0138433

(51) Int. Cl.
| | | |
|---|---|---|
| *H01L 27/115* | (2006.01) | |
| *H01L 23/535* | (2006.01) | |
| *H01L 29/51* | (2006.01) | |
| *H01L 29/423* | (2006.01) | |
| *H01L 27/06* | (2006.01) | |

(52) U.S. Cl.
CPC ........ *H01L 27/11582* (2013.01); *H01L 23/535* (2013.01); *H01L 27/0688* (2013.01); *H01L 27/11578* (2013.01); *H01L 29/42348* (2013.01); *H01L 29/513* (2013.01)

(58) Field of Classification Search
None
See application file for complete search history.

(56) References Cited

U.S. PATENT DOCUMENTS

| | | | |
|---|---|---|---|
| 8,013,383 B2 | 9/2011 | Kidoh et al. | |
| 8,030,700 B2 | 10/2011 | Sakamoto | |
| 8,482,049 B2 * | 7/2013 | Son .................... | G11C 16/0483 257/314 |
| 8,877,626 B2 * | 11/2014 | Lee .................... | H01L 27/11578 257/288 |
| 2013/0034945 A1 | 2/2013 | Park | |
| 2013/0134492 A1 | 5/2013 | Yang et al. | |
| 2014/0054675 A1 | 2/2014 | Lee et al. | |
| 2014/0054676 A1 | 2/2014 | Nam et al. | |
| 2014/0070300 A1 | 3/2014 | Jang et al. | |
| 2014/0070302 A1 | 3/2014 | Yoo et al. | |
| 2016/0043100 A1 * | 2/2016 | Lee ....................... | H01L 23/535 257/324 |

* cited by examiner

*Primary Examiner* — Benjamin Sandvik
(74) *Attorney, Agent, or Firm* — Myers Bigel & Sibley, P.A.

(57) ABSTRACT

A semiconductor memory device may include stacks arranged in a first direction and vertical channel structures provided through the stacks. Each of the stacks may include gate electrodes and insulating layers alternately stacked on a substrate. Each of the vertical channel structures may include a semiconductor pattern connected to the substrate and a vertical channel pattern connected to the semiconductor pattern. Each of the semiconductor patterns may have a recessed sidewall, and the semiconductor patterns may have minimum widths different from each other.

20 Claims, 19 Drawing Sheets

SEMICONDUCTOR MEMORY DEVICES AND METHODS OF FABRICATING THE SAME

CROSS-REFERENCE TO RELATED APPLICATION

This U.S. non-provisional patent application claims priority under 35 U.S.C. §119 to Korean Patent Application No. 10-2014-0138433, filed on Oct. 14, 2014, in the Korean Intellectual Property Office, the disclosure of which is incorporated by reference herein in its entirety.

BACKGROUND

Example embodiments of the inventive concepts relate to semiconductor memory devices and methods of fabricating the same.

Higher integration of semiconductor devices is required to satisfy consumer demand for superior performance and inexpensive prices. In the case of semiconductor memory devices, since their integration is an important factor in determining product cost, increased integration is important. In the case of typical two-dimensional or planar semiconductor memory devices, since their integration is mainly determined by the area occupied by a unit memory cell, integration is greatly influenced by the level of fine pattern forming technology used. However, the extremely expensive process equipment needed to increase pattern fineness sets a practical limitation on increasing integration for two-dimensional or planar semiconductor devices. Accordingly, there is an increasing demand for semiconductor memory devices with vertically-stacked memory cells.

SUMMARY

Example embodiments of the inventive concepts provide highly integrated, highly reliable semiconductor memory devices.

Other example embodiments of the inventive concepts provide methods of fabricating highly integrated, highly reliable semiconductor memory devices.

According to example embodiments of the inventive concept, a semiconductor memory device may include stacks separated from each other in a first direction by a trench, where each of the stacks may include insulating layers and gate electrodes alternately and repeatedly stacked on a substrate, first and second semiconductor patterns arranged along the first direction, each of the first and second semiconductor patterns being inserted in a lower portion of each of the stacks and being connected to the substrate, first and second vertical channel patterns in each of the stacks and on the respective first and second semiconductor patterns, and a common source plug in the trench. The first semiconductor pattern may be closer to the trench than the second semiconductor pattern. A minimum width of the first semiconductor pattern may be less than that of the second semiconductor pattern.

In example embodiments, each of the stacks may include a first gate electrode intersected with the first and second semiconductor patterns, and second gate electrodes vertically stacked on the first gate electrode to enclose the first and second vertical channel patterns.

In example embodiments, a data storage pattern may be between the second gate electrodes and the first vertical channel pattern, and between the second gate electrodes and the second vertical channel pattern.

In example embodiments, the first gate electrode may enclose sidewalls of the first and second semiconductor patterns, have end portions spaced apart from each other in the first direction, have a first thickness between the first and second semiconductor patterns, and have a second thickness at the end portions. The second thickness may be larger than the first thickness.

In example embodiments, the first and second semiconductor patterns may have recessed sidewalls, respectively.

In example embodiments, the minimum width of the first semiconductor pattern and the minimum width of the second semiconductor pattern may be between the recessed sidewalls.

In example embodiments, the recessed sidewall of the second semiconductor pattern may include a first recessed sidewall and a second recessed sidewall opposite to each other in the first direction, and a first maximum recess depth of the first recessed sidewall may be different from a second maximum recess depth of the second recessed sidewall.

In example embodiments, a difference between the first maximum recess depth and the second maximum recess depth is from about 10 Å to about 60 Å.

In example embodiments, a maximum recess depth of the recessed sidewall of the first semiconductor pattern may be substantially uniform in all directions parallel to a top surface of the substrate.

According to example embodiments of the inventive concept, a semiconductor memory device may include stacks separated from each other in a first direction by a trench, where each of the stacks may include insulating layers and gate electrodes alternately and repeatedly stacked on a substrate, semiconductor patterns arranged along the first direction, each of the semiconductor patterns being inserted in a lower portion of each of the stacks and being connected to the substrate, vertical channel patterns in each of the stacks and on the respective semiconductor patterns, and a common source plug in the trench. At least one of the semiconductor patterns may have recessed sidewalls, which are opposite to each other in the first direction, and where maximum recess depths of the recessed sidewalls may be different from each other.

In example embodiments, the recessed sidewalls of the at least one of the semiconductor patterns may include first and second recessed sidewalls, where the first recessed sidewall is closer to the trench than the second recessed in the first direction. A first maximum recess depth of the first recessed sidewall may be greater than a second maximum recess depth of the second recessed sidewall.

In example embodiments, a difference between the first maximum recess depth and the second maximum recess depth may range from about 10 Å to about 60 Å.

In example embodiments, a first height of the first recessed sidewall may be greater than a second height of the second recessed sidewall.

In example embodiments, respective ones of the stacks may include a first gate electrode intersected with the semiconductor patterns. Here, the first gate electrode may be thicker adjacent the first recessed sidewall than adjacent the second recessed sidewall.

In example embodiments, the semiconductor device may further include a tunnel insulating layer, a charge storing layer, and a blocking insulating layer, which are between the vertical channel patterns and respective ones of the stacks.

According to example embodiments of the inventive concept, a semiconductor memory device may include a substrate having a first common source region and a second common source region in an upper surface thereof, a plurality of insulating layers and a plurality of gate electrodes alternately and repeatedly stacked on the upper surface of the substrate in between the first and second common source regions, first and second semiconductor patterns that extend upwardly from the substrate, and first and second vertical channel patterns on the respective first and second semiconductor patterns. The first and second common source regions may be spaced apart from each other in a first direction and extending in a second direction that is perpendicular to the first direction. The insulating layers and gate electrodes may be stacked in a third direction that is perpendicular to the first and second directions. The first and second semiconductor patterns may be spaced apart from each other along the first direction. A first portion of the lowermost of the gate electrodes that is between the first and second semiconductor patterns may have a first thickness adjacent the first semiconductor pattern and a second thickness adjacent the second semiconductor pattern, where the first thickness exceeds the second thickness.

In example embodiments, a first sidewall of the first semiconductor pattern may include a first recess and a first sidewall of the second semiconductor pattern that faces the first sidewall of the first semiconductor pattern includes a second recess, and wherein the lowermost of the gate electrodes extends into the first and second recesses.

In example embodiments, a first distance between the first semiconductor pattern and the one of the first and second common source regions that is closest thereto may be less than a second distance between the second semiconductor pattern and the one of the first and second common source regions that is closest thereto.

In example embodiments, a second portion of the lowermost of the gate electrodes that is adjacent a second sidewall of the first semiconductor pattern that is opposite the first sidewall of the first semiconductor pattern may have the first thickness, and a third portion of the lowermost of the gate electrodes that is adjacent a second sidewall of the second semiconductor pattern that is opposite the first sidewall of the second semiconductor pattern may have the first thickness.

In example embodiments, a first depth of the first recess may be greater than a second depth of the second recess.

BRIEF DESCRIPTION OF THE DRAWINGS

Example embodiments will be more clearly understood from the following description taken in conjunction with the accompanying drawings. The accompanying drawings represent non-limiting, example embodiments as described herein.

Figure 1:
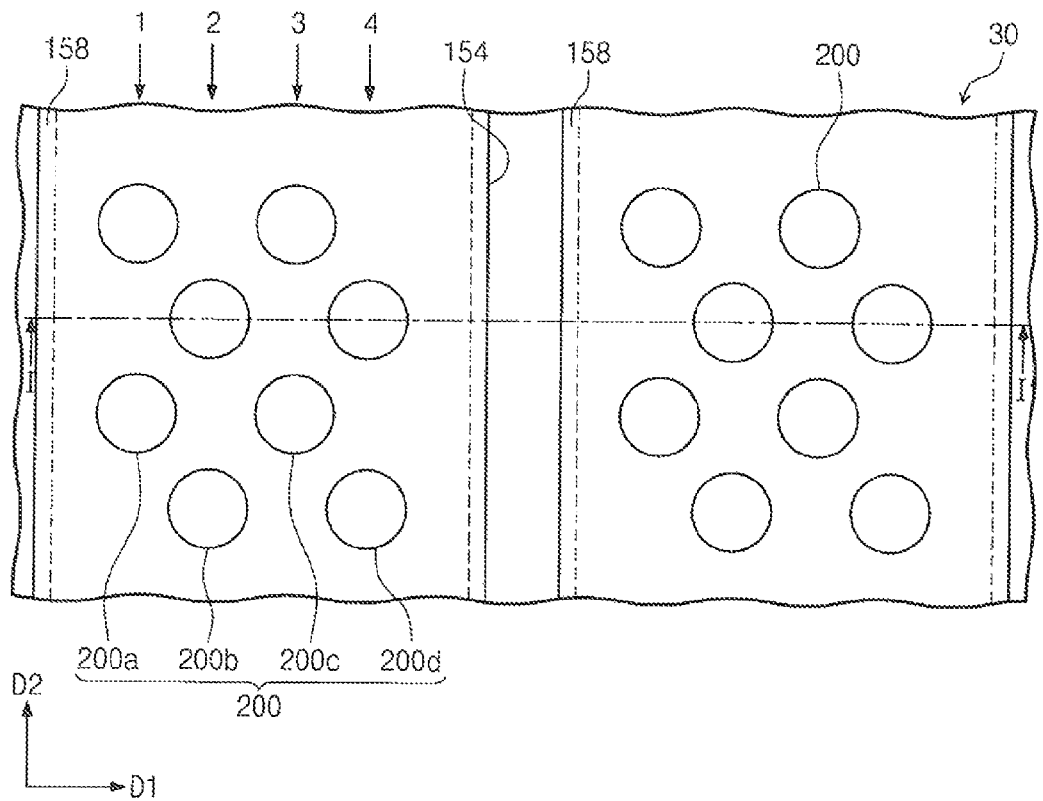
FIG. 1 is a schematic plan view illustrating semiconductor memory devices according to example embodiments of the inventive concepts.

The above-described are intended to illustrate the general characteristics of methods, structures and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete. In the drawings, the thicknesses of layers and regions are exaggerated for clarity. Like reference numerals denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
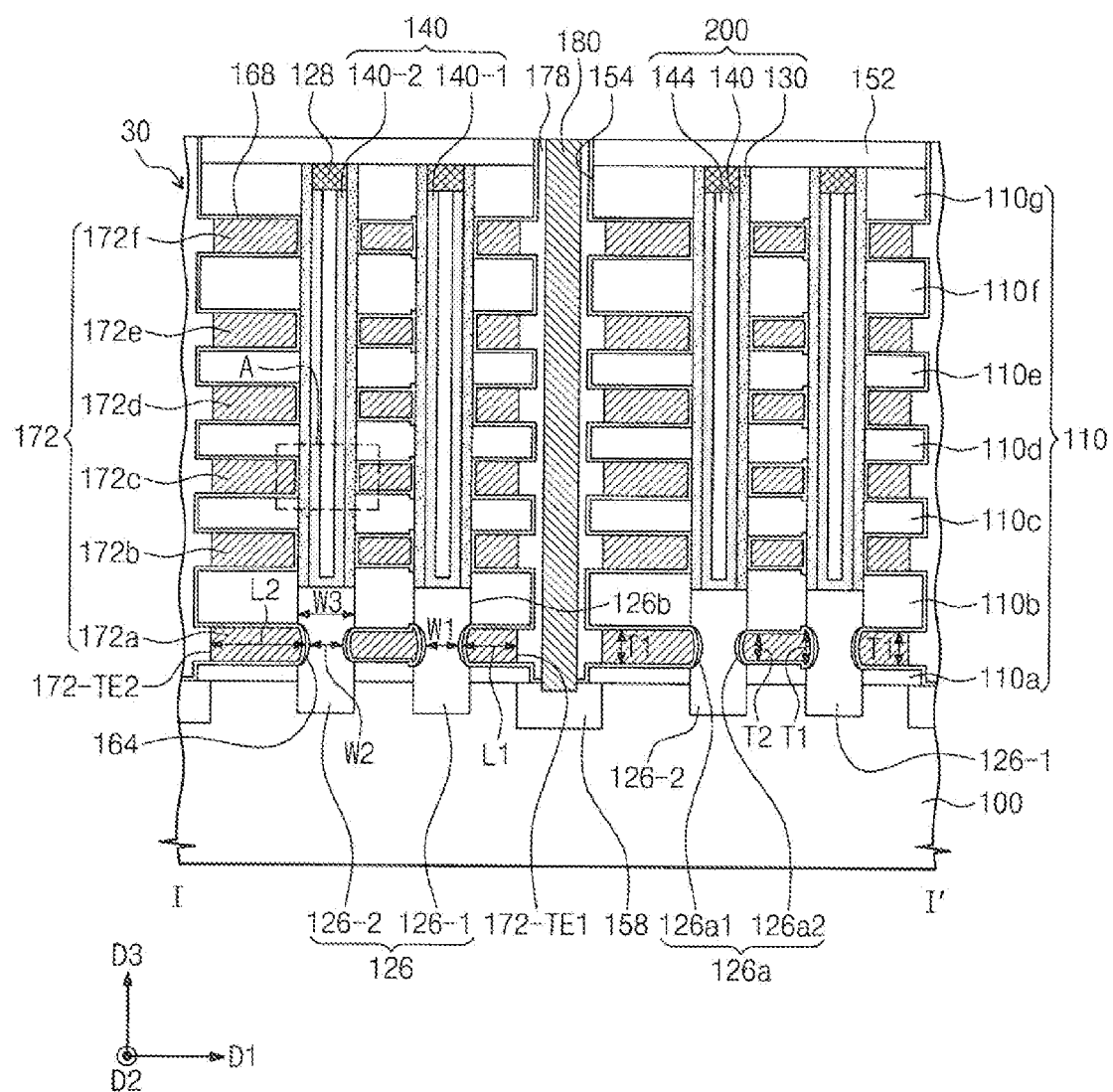
FIG. 2 is a sectional view taken along line I-I' of FIG. 1 to illustrate semiconductor memory devices according to example embodiments of the inventive concepts.
Figure 3:
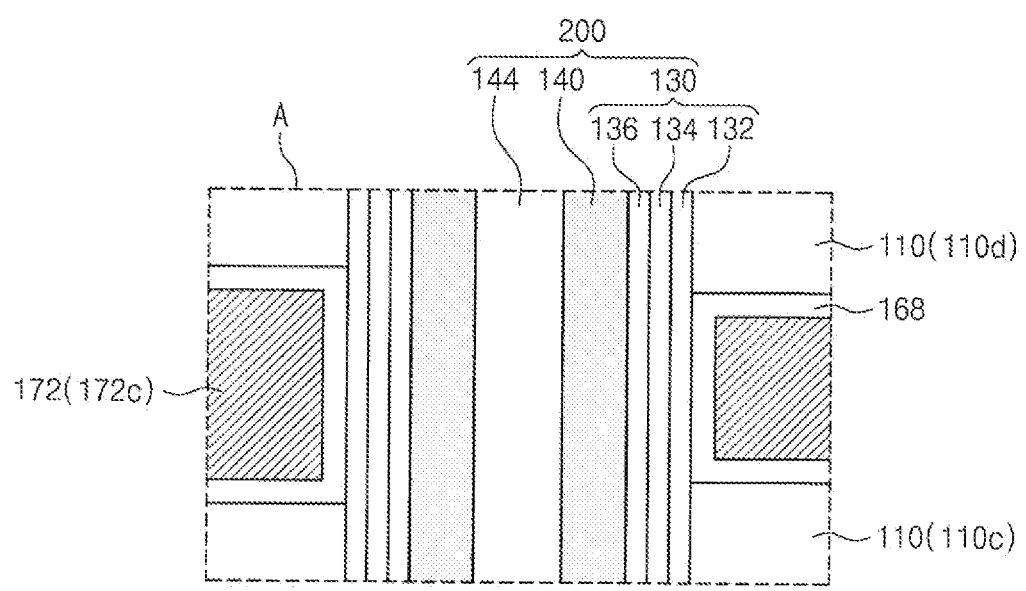
FIG. 3 is an enlarged view illustrating portion A of FIG. 2.
Figure 4:
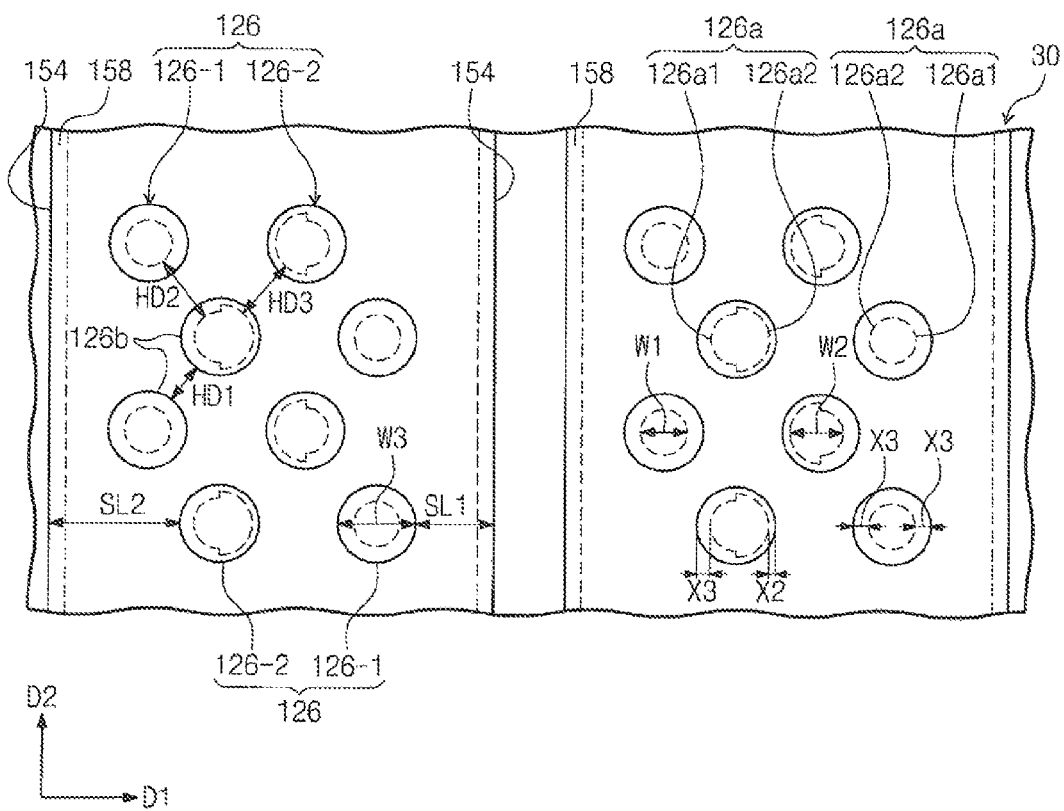
FIG. 4 is a schematic plan view illustrating a portion of semiconductor memory devices in which the semiconductor patterns shown in FIG. 2 are provided.
Figure 5A:
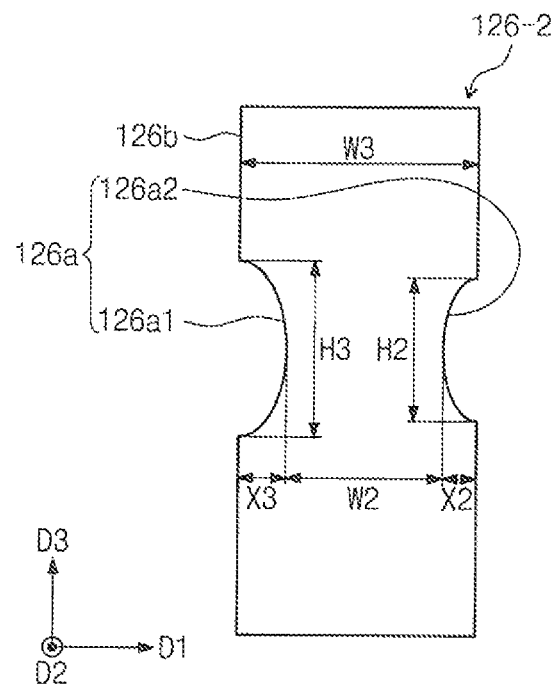
FIGS. 5A and 5B are sectional views schematically illustrating the semiconductor patterns shown in FIG. 2.
Figure 5B:
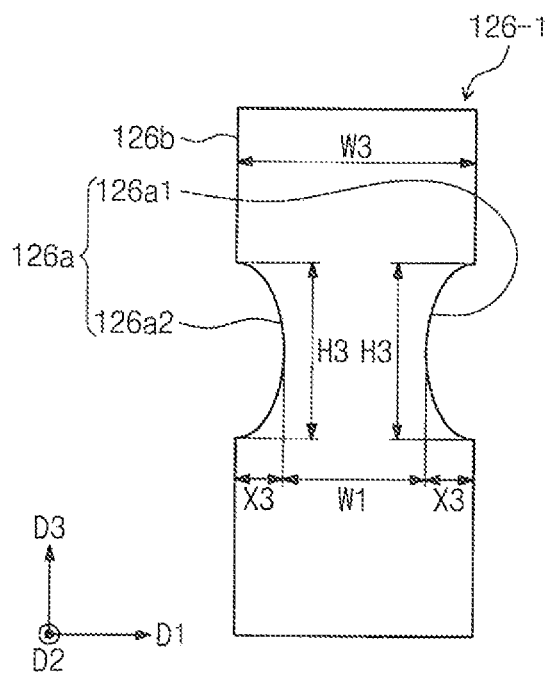

FIG. 1 is a schematic plan view illustrating semiconductor memory devices according to example embodiments of the inventive concepts. FIG. 2 is a sectional view taken along line I-I' of FIG. 1. FIG. 3 is an enlarged view illustrating portion A of FIG. 2. FIG. 4 is a schematic plan view illustrating a portion of semiconductor memory devices in which the semiconductor patterns shown in FIG. 2 are provided. FIGS. 5A and 5B are sectional views schematically illustrating the semiconductor patterns shown in FIG. 2.

Referring to FIGS. 1 through 5, semiconductor memory devices according to example embodiments of the inventive concepts may include a substrate 100, stacks 30 including insulating layers 110 and gate electrodes 172 alternately and repeatedly stacked on the substrate 100, and vertical channel structures 200 penetrating the stacks 30 and being spaced apart from each other in a first direction D1 that is parallel to the top surface of the substrate 100. The vertical channel structures 200 may extend from the substrate 100 in a third direction D3 that is perpendicular to the top surface of the substrate 100.

The substrate 100 may be formed of or include a semiconductor material. For example, the substrate 100 may be a silicon single crystalline wafer, a single crystalline germanium wafer, and/or a single crystalline silicon-germanium wafer. In example embodiments, the substrate 100 may be a semiconductor-on-insulator (SOI) substrate. For example, the substrate 100 may include a semiconductor substrate, on which transistors are integrated, an insulating layer covering the semiconductor substrate, and an upper semiconductor layer (e.g., a silicon layer, a silicon-germanium layer, or a germanium layer) provided on the insulating layer. The substrate 100 may be a semiconductor substrate that is doped to have a first conductivity type (e.g., p-type).

As shown in FIG. 1, the stacks 30 may extend in a second direction D2, which is at an angle to the first direction D1 and is parallel to the top surface of the substrate 100. The stacks 30 may be line-shaped structures. Accordingly, the insulating layers 110 and the gate electrodes 172 of respective ones of the stacks 30 may be line patterns extending parallel to the second direction D2. A plurality of the insulating layers 110 may be stacked on the substrate 100 along a third direction D3. The insulating layers 110 may include, for example, first to seventh insulating layers 110a, 110b, 110c, 110d, 110e, 110f, and 110g, but example embodiments of the inventive concepts are not limited thereto. In example embodiments, the number of the insulating layers 110 stacked on the substrate 100 may be at least eight. At least one of the insulating layers 110 may have a thickness different from those of the others. For example, the lowermost one (e.g., the first insulating layer 110a) of the insulating layers 110 may have a thickness smaller than those of the second to seventh insulating layers 110b to 110g. Further, the second, sixth, and seventh insulating layers 110b, 110f, and 110g may be formed thicker than the third to fifth insulating layers 110c, 110d, and 110e. The insulating layers 110 may be formed of or include silicon oxide.

A plurality of the gate electrodes 172 may be stacked along the third direction D3. The gate electrodes 172 may include, for example, first to sixth gate electrodes 172a, 172b, 172c, 172d, 172e, and 172f, but example embodiments of the inventive concepts are not limited thereto. In example embodiments, the number of the gate electrodes 172 stacked on the substrate 100 may be at least seven. The gate electrodes 172 may include control gate electrodes, which are coupled to memory cells of the semiconductor memory device (e.g., a vertical-type NAND flash memory device). For example, some (e.g., the second to fifth gate electrodes 172b to 172e) of the gate electrodes 172, which may be interposed between the uppermost and lowermost ones (e.g., the sixth and first gate electrode 172f and 172a), may serve as the control gate electrodes or word lines connecting the control gate electrodes. The gate electrodes 172 coupled to the vertical channel structures 200 may constitute a plurality of memory cell strings. The memory cell strings may include memory cells that are arranged on the substrate 100 along the third direction D3.

The first and sixth gate electrodes 172a and 172f may be used as gate electrodes of ground and string selection transistors GST and SST, respectively. For example, the sixth gate electrode 172f may be used as a gate electrode of the string selection transistor SST, which controls an electric connection between a bit line and the vertical channel structures 200, and the first gate electrode 172a may be used as a gate electrode of the ground selection transistor GST, which controls an electric connection between a common source region 158 formed in the substrate 100 and the vertical channel structures 200.

The gate electrodes 172 may be provided to enclose the vertical channel structures 200. The gate electrodes 172 may have first and second end portions 172-TE1 and 172-TE2 spaced apart from each other in the first direction D1. The gate electrodes 172 may have substantially the same thickness and shape. A thickness of the gate electrodes 172 may be changed with a horizontal position thereof. For example, the gate electrodes 172 may have a first thickness T1 at a region adjacent the end portions 172-TE1 and 172-TE2. In the gate electrodes 172, a portion positioned between the vertical channel structures 200 may have the first thickness T1 and another portion positioned between the vertical channel structures 200 may have a second thickness T2. The first thickness T1 may be greater than the second thickness T2.

The gate electrodes 172 may include a gate conductive layer. The gate conductive layer may include, for example, a metal silicide layer, a metal layer, and/or a metal nitride layer. The metal silicide layer may include, for example, cobalt silicide, titanium silicide, tungsten silicide, and/or tantalum silicide. The metal layer may include, for example, tungsten, nickel, cobalt, titanium, and/or tantalum. The metal nitride layer may include, for example, titanium nitride, tungsten nitride, and/or tantalum nitride.

The vertical channel structures 200 may be electrically connected to the substrate 100 through the stacks 30. Referring to FIG. 1, the vertical channel structures 200 penetrating the stacks 30 may be arranged in a first column 1 and a second column 2, which are parallel to the second direction D2. The vertical channel structures 200 may include first vertical channel structures 200a along the first column 1 and second vertical channel structures 200b along the second column 2, and in this case, the first and second columns 1 and 2 may be spaced apart from each other in the first direction D1. The vertical channel structures 200 may be arranged in a zigzag pattern.

The vertical channel structures 200 may further include third and fourth vertical channel structures 200c and 200d, which may be arranged in third and fourth columns 3 and 4, respectively, and may be provided adjacent the first and second columns 1 and 2 or the first and second vertical channel structures 200a and 200b in the first direction D1. The first and third vertical channel structures 200a and 200c may be disposed to have symmetry in the first direction D1 with respect to the second vertical channel structures 200b. The second and fourth vertical channel structures 200b and 200d may be disposed to have symmetry in the first direction D1 with respect to the third vertical channel structures 200c. The vertical channel structures 200 may constitute a plurality of groups, with each group including the first to fourth columns. The groups may be arranged spaced apart from each other, in the first direction D1, with the common source region 158 interposed therebetween. In certain embodiments, a group of the vertical channel structures 200 may be configured to include N columns, where N is an integer that is different from four.

The vertical channel structures 200 may include a semiconductor pattern 126, a data storage pattern 130, a vertical channel pattern 140, and an insulating gap-filling pattern 144. The data storage pattern 130, the vertical channel pattern 140, and the insulating gap-filling pattern 144 may be disposed on the semiconductor pattern 126.

The semiconductor patterns 126 may extend into the substrate 100. The semiconductor patterns 126 may include a lower portion that is inserted or buried in the substrate 100 and a pillar-shaped upper portion that protrudes upward from the substrate 100. The semiconductor patterns 126 may be positioned at a lower portion of the stack 30. For example, the semiconductor patterns 126 may have a top surface that may be positioned at a higher level than that of the first gate electrode 172a. The semiconductor patterns 126 may include silicon (Si), germanium (Ge), silicon-germanium (SiGe), III-V semiconductor compounds, and/or II-VI semiconductor compounds. The semiconductor patterns 126 may be epitaxial patterns including single crystalline silicon. The semiconductor patterns 126 may be undoped patterns or doped semiconductor patterns having the same conductivity type as the substrate 100.

The semiconductor patterns 126 may include a first semiconductor pattern 126-1 and a second semiconductor pattern 126-2, which may be disposed side-by-side in the first direction D1. Trenches 154 may be provided on either side of a group of the first and second semiconductor patterns. When viewed in a plan view, the first semiconductor pattern 126-1 may be disposed closer to a nearest trench 154 than is the second semiconductor pattern 126-2. For example, as shown in FIG. 4, a separation distance SL1 between the first semiconductor pattern 126-1 and the nearest trench 154 may be shorter than a separation distance SL2 between the second semiconductor pattern 126-2 and the trench 154. In example embodiments, the first semiconductor pattern 126-1 may be a part of the first and fourth vertical structures 200a and 200d of the first and fourth columns 1 and 4, and the second semiconductor pattern 126-2 may be a part of the second and third vertical structures 200b and 200c of the second and third columns 2 and 3.

The semiconductor patterns 126 may have recessed sidewalls 126a. For example, the recessed sidewalls 126a of the semiconductor patterns 126 may include a first recessed sidewall 126a1 and a second recessed sidewall 126a2, which are opposite to each other in the first direction D1. The first recessed sidewall 126a1 may be closer to the trench 154 than the second recessed sidewall 126a2. As shown in FIG. 5B, the first and second recessed sidewalls 126a1 and 126a2 of the first semiconductor pattern 126-1 may have substantially the same maximum recess depth X3. As shown in FIG. 5A, the first and second recessed sidewalls 126a1 and 126a2 of the second semiconductor pattern 126-2 may have maximum recess depths different from each other. For example, the maximum recess depth X3 of the first recess sidewall 126a1 of the second semiconductor pattern 126-2 may be greater than the maximum recess depth X2 of the second recessed sidewall 126a2. The first and second recessed sidewalls 126a1 and 126a2 of the second semiconductor pattern 126-2 may be formed in such a way that a difference between the maximum recess depths X3 and X2 ranges from about 10 Å to about 60 Å.

The first and second recessed sidewalls 126a1 and 126a2 of the first semiconductor pattern 126-1 and the first recessed sidewall 126a1 of the second semiconductor pattern 126-2 may have substantially the same maximum recess depth X3.

The first and second recessed sidewalls 126a1 and 126a2 of the first semiconductor pattern 126-1 may have substantially the same height H3. The height H3 of the first recessed sidewall 126a1 of the second semiconductor pattern 126-2 may be greater than a height H2 of the second recessed sidewall 126a2.

The semiconductor patterns 126 may have a minimum width. The minimum width of the semiconductor patterns 126 may correspond to the minimum space between the recessed sidewalls 126a1 and 126a2 of the semiconductor patterns 126. There may be a difference in the minimum widths between the semiconductor patterns 126. For example, the minimum width of the first semiconductor pattern 126-1 may be different from that of the second semiconductor pattern 126-2. A first minimum width W1 of the first semiconductor pattern 126-1 may be smaller than a second minimum width W2 of the second semiconductor pattern 126-2. For example, a difference between the first minimum width W1 of the first semiconductor pattern 126-1 and the second minimum width W2 of the second semiconductor pattern 126-2 may be substantially equal to a difference between the maximum recess depth X2 of the second recessed sidewall 126a2 of the second semiconductor pattern 126-2 and the maximum recess depth X3 of the first recessed sidewall 126a1 of the second semiconductor pattern 126-2. The upper portions of the first and second semiconductor patterns 126-1 and 126-2 may have a maximum width W3. For example, in the first and second semiconductor patterns 126-1 and 126-2, the maximum width W3 may be given by a distance between upper sidewalls 126b that are in contact with the second insulating layer 110b.

Referring to FIG. 4, a second distance HD2 between the recessed sidewalls 126a of first and second semiconductor patterns 126-1 and 126-2 that are adjacent each other in the second direction may be greater than a first distance HD1 between the upper sidewalls 126b of first and second semiconductor patterns 126-1 and 126-2 that are adjacent each other in the second direction D2. This makes it possible to increase a width of a region, which is occupied by the first gate electrode 172a and is positioned between the first and second semiconductor patterns 126-1 and 126-2. A third distance HD3 between the recessed sidewalls 126a of the second semiconductor patterns 126-2 adjacent each other in the second direction D2 may be shorter than the second distance HD2, but example embodiments of the inventive concepts are not limited thereto. For example, in certain embodiments, the third distance HD3 may be substantially equal to the second distance HD2.

A gate oxide layer 164 may be provided on the recessed sidewall 126a of the semiconductor patterns 126. The gate oxide layer 164 may be provided between the first gate electrode 172a and the semiconductor patterns 126. The gate oxide layer 164 may include, for example, silicon oxide.

The first gate electrode 172a may have substantially the same thickness (e.g., the first thickness T1) at positions adjacent the first and second recessed sidewalls 126a1 and 126a2 of the first semiconductor pattern 126-1. The first gate electrode 172a may have the first thickness T1 at a position adjacent the first recessed sidewall 126a1 of the second semiconductor pattern 126-2 and may have the second thickness T2 at a position adjacent the second recessed sidewall 126a2 of the second semiconductor pattern 126-2. The first thickness T1 may be greater than the second thickness T2. A horizontal distance L1 between the recessed sidewalls 126a of the first semiconductor pattern 126-1 and the first end portion 172-TE1 of the first gate electrode 172a may be shorter than a horizontal distance L2 between the recessed sidewalls 126a of the second semiconductor pattern 126-1 and the end portion 172-TE2 of the first gate electrode 172a.

Vertical channel patterns 140 extending parallel to the third direction D3 may be provided on the semiconductor patterns 126, respectively. The vertical channel patterns 140 may be connected to the semiconductor patterns 126, respectively. For example, a first vertical channel pattern 140-1 may be provided on the first semiconductor pattern 126-1, and a second vertical channel pattern 140-2 may be provided on the second semiconductor pattern 126-2.

The vertical channel patterns 140 may be provided between the data storage pattern 130 and the insulating gap-filling pattern 144. The vertical channel patterns 140 may be shaped like a hollow cylinder with a closed top. In certain embodiments, the vertical channel patterns 140 may be shaped like a hollow cylinder with open top and bottom. In other example embodiments, the vertical channel patterns 140 may be shaped like a solid circular pillar, and in this case, the insulating gap-filling patterns 144 may not be provided in the vertical channel patterns 140. The vertical channel patterns 140 may be a pattern that is formed of a polycrystalline, amorphous, or single crystalline semiconductor material. For example, the vertical channel patterns 140 may include silicon (Si), germanium (Ge), silicon-germanium (SiGe), III-V semiconductor compounds, and/or II-VI semiconductor compounds. As an example, the vertical channel patterns 140 may include poly silicon. The vertical channel patterns 140 may include an undoped semiconductor material and/or a semiconductor material doped to have the same conductivity type as the substrate 100.

The data storage pattern 130 may be provided between a corresponding pair of the stacks 30 and the vertical channel patterns 140. The data storage pattern 130 may have a hollow shape with open top and bottom. The data storage pattern 130 may be a thin film, in which data can be stored. For example, data stored in the data storage pattern 130 may be changed using a Fowler-Nordheim (FN) tunneling effect, which is caused by a voltage difference between a corresponding pair of the vertical channel structures 200 and the gate electrodes 172, but example embodiments of the inventive concepts are not limited thereto. In certain embodiments, the data storage pattern 130 may include a thin film (for example, as in a phase changeable memory device or a variable resistance memory device), whose data can be changed using other writing principles.

Referring to FIG. 3, the data storage pattern 130 may include a first blocking insulating layer 132 adjacent the gate electrodes 172, a tunnel insulating layer 136 adjacent each of the vertical channel patterns 140, and a charge storing layer 134 therebetween. The tunnel insulating layer 136 may be, for example, a silicon oxide layer. The charge storing layer 134 may be a trap insulating layer and/or an insulating layer with conductive nano dots. The trap insulating layer may include, for example, silicon nitride. The first blocking insulating layer 132 may include a silicon oxide layer and/or a high-k dielectric layer (e.g., aluminum oxide or hafnium oxide). The first blocking insulating layer 132 may include a single layer or a plurality of layers. As an example, the first blocking insulating layer 132 may be a single layer made of silicon oxide. As another example, the first blocking insulating layer 132 may be a multi-layered structure including an aluminum oxide layer and/or a hafnium oxide layer.

A second blocking insulating layer 168 may be further provided between the stacks 30 and the vertical channel structures 200. The second blocking insulating layer 168 may extend between adjacent insulating layers 110 and the gate electrodes 172. For example, the second blocking insulating layer 168 may extend substantially parallel to the top surface of the substrate 100 and may cover top and bottom surfaces of the gate electrodes 172. The second blocking insulating layer 168 may include a single layer or a plurality of layers. For example, the second blocking insulating layer 168 may include high-k dielectric materials (e.g., aluminum oxide and/or hafnium oxide). In certain embodiments, the second blocking insulating layer 168 may not be formed.

The insulating gap-filling pattern 144 may be provided in the vertical channel patterns 140. The insulating gap-filling pattern 144 may include a silicon oxide layer and/or a silicon nitride layer.

Conductive pads 128 may be provided on the vertical channel structures 200, respectively. For example, the conductive pads 128 may be disposed on top portions of the vertical channel patterns 140, respectively and may be connected to the vertical channel patterns 140, respectively. The conductive pads 128 may include a conductive material. The conductive pads 128 may include, for example, poly silicon and/or amorphous silicon. In example embodiments, the conductive pads 128 may be impurity regions doped with impurities. The conductive pads 128 and/or the top portions of the vertical channel patterns 200 in contact with the conductive pads 128 may serve as drain regions of the memory cell strings. The conductive pads 128 may be connected to a plurality of bit lines, respectively.

A capping insulating layer 152 may be provided on the stacks 30 to cover the conductive pads 128. The capping insulating layer 152 may be formed of a silicon oxide layer.

The trenches 154 may be formed on the substrate 100 to separate the stacks 30 from each other. For example, the trenches 154 may be provided to separate vertical channel groups, each of which includes four columns of the vertical channel structures 200 arranged in the first direction D1, from each other. The trenches 154 may extend parallel to the second direction D2. The trenches 154 may extend from a top surface of the capping insulating layer 152 to the top surface of the substrate 100 in a vertical direction. In certain embodiments, the trenches 154 may extend into the substrate 100. For example, the trenches 154 may have a bottom surface lower than the top surface of the substrate 100.

The common source regions 158 may be provided in the substrate 100 between the stacks 30. For example, the common source regions 158 may be formed in a portion of the substrate 100 exposed by the trenches 154 and may extend parallel to the second direction D2. The common source regions 158 may be conductive impurity regions. In example embodiments, the common source regions 158 may be doped to have a second conductivity type different from that of the substrate 100. For example, the common source regions 158 may include n-type impurities, such as arsenic (As) and/or phosphorus (P).

Each common source plug 180 may be provided on each common source region 158. Each common source plug 180 may be provided in a respective trench 154 and may be connected to a respective common source region 158. The common source plug 180 may reduce electric resistance of a path including the common source region 158. When viewed in a plan view, the common source plug 180 may be a line-shaped structure extending parallel to the second direction D2. In certain embodiments, a plurality of common source plugs 180, ones of which may be shaped like an island, may be arranged along the second direction D2. The common source plugs 180 may include a conductive material. For example, the common source plugs 180 may include poly silicon and/or metal (e.g., tungsten or copper).

An insulating separation layer 178 may be provided between the stacks 30 and the common source plug 180. For example, the insulating separation layer 178 may be provided between the gate electrodes 172 and the common source plug 180. The insulating separation layer 178 may protect the end portions 172-TE1 and 172-TE2 of the gate electrodes 172. The insulating separation layer 178 may include an oxide layer.

FIGS. 6 through 8, 10, 11, 14, 17, and 18 are sectional views taken along line I-I' of FIG. 1 to illustrate a method of fabricating a semiconductor memory device according to example embodiments of the inventive concepts (e.g., described with reference to FIGS. 1 through 4). FIG. 9 is an enlarged view of portion B of FIG. 8. FIG. 12 is a schematic plan view taken at a level of region G of FIG. 1. FIG. 13 is an enlarged view of region G of FIG. 11. FIG. 15 is a schematic plan view taken at a level of region G' of FIG. 14. FIG. 16 is an enlarged view of a region G' of FIG. 14.

Figure 6:
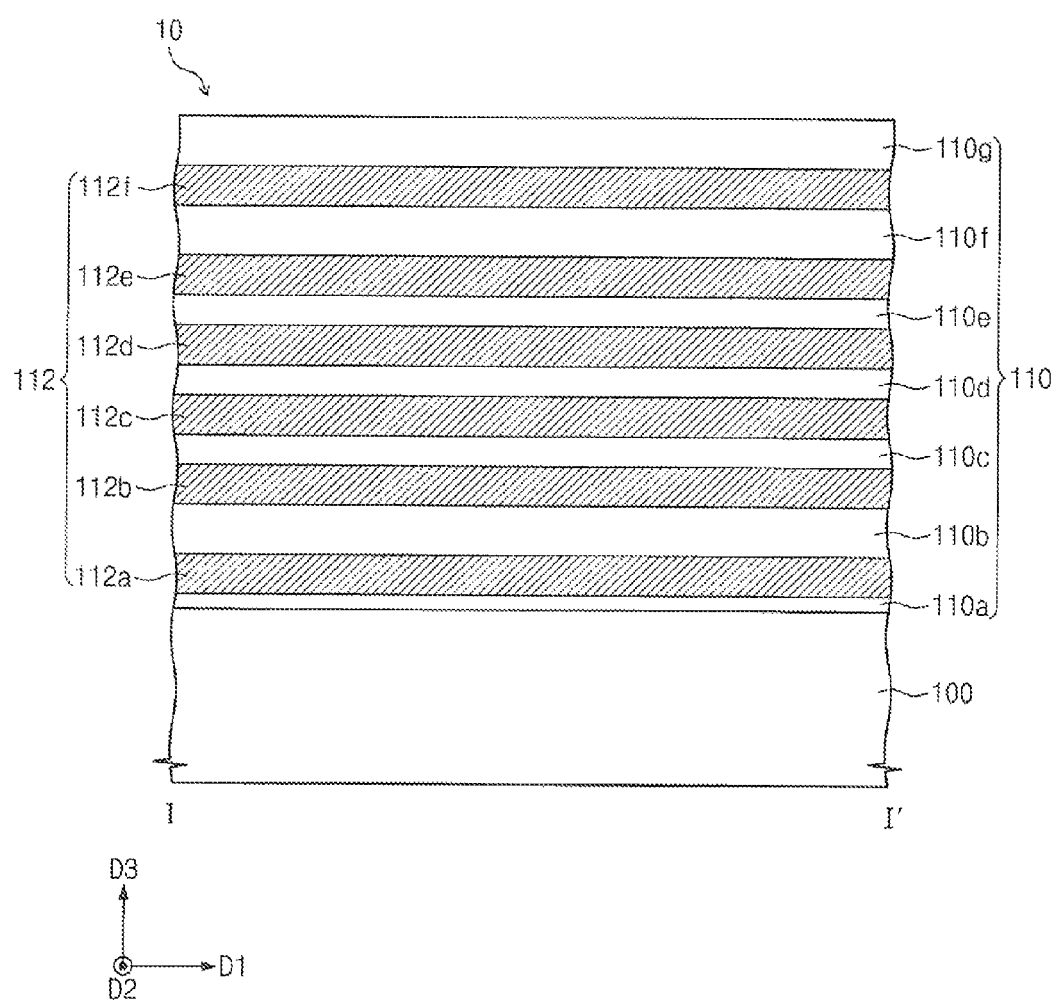
FIGS. 6 through 8, 10, 11, 14, 17, and 18 are sectional views taken along line I-I' of FIG. 1 to illustrate methods of fabricating semiconductor memory devices according to example embodiments of the inventive concepts (e.g., described with reference to FIGS. 1 through 4).

Referring to FIG. 6, a molding structure 10 may be formed on the substrate 100. For example, the molding structure 10 may be formed by alternately and repeatedly stacking insulating layers 110 and sacrificial layers 112 on the substrate 100. The molding structure 10 may include a plurality of insulating layers 110 and a plurality of sacrificial layers 112. The insulating layers 110 may include, for example, first to seventh insulating layers 110a, 110b, 110c, 110d, 110e, 110f, and 110g, but example embodiments of the inventive concepts are not limited thereto. In certain embodiments, eight or more insulating layers 110 may be sequentially stacked on the substrate 100. The sacrificial layers 112 may be stacked on the substrate 100, and respective ones of the sacrificial layers 112 may be interposed between a corresponding pair of the insulating layers 112. The sacrificial layers 112 may include, for example, first to sixth sacrificial layers 112a, 112b, 112c, 112d, 112e, and 112f, but example embodiments of the inventive concepts are not limited thereto. In certain embodiments, seven or more sacrificial layers 112 may be sequentially stacked on the substrate 100.

The substrate 100 may be formed of or include a semiconductor material. For example, the substrate 100 may be a silicon single crystalline wafer, a single crystalline germanium wafer, or a single crystalline silicon-germanium wafer. In example embodiments, the substrate 100 may be a semiconductor-on-insulator (SOI) substrate. For example, the substrate 100 may include a semiconductor substrate, on which transistors may be integrated, an insulating layer covering the semiconductor substrate, and an upper semiconductor layer (e.g., a silicon layer, a silicon-germanium layer, or a germanium layer) provided on the insulating layer. The substrate 100 may be a semiconductor substrate that is doped to have a first conductivity type (e.g., p-type).

The sacrificial layers 112 may be formed of a material having an etch selectivity with respect to the insulating layers 110. For example, the sacrificial layers 112 may be formed of a material having an etch rate higher than that of the insulating layers 110, in a subsequent wet etching process for removing the sacrificial layers 112. As an example, the insulating layers 110 may be a silicon oxide layer or a silicon nitride layer, and the sacrificial layers 112 may be a material which is selected from the group consisting of silicon oxide, silicon nitride, silicon carbide, silicon, and silicon germanium to have a selectively removable property with respect to the insulating layers 110. In example embodiments, the insulating layers 110 may be silicon oxide layers, and the sacrificial layers 112 may be silicon nitride layers.

The sacrificial layers 112 may be formed by a thermal chemical vapor deposition (thermal CVD) process, a plasma-enhanced chemical vapor deposition (PE-CVD) process, or an atomic layer deposition (ALD) process. The first to sixth sacrificial layers 112a to 112f may be formed to have substantially the same thickness. The insulating layers 112 may be formed by a thermal oxidation process, a thermal CVD process, a PE-CVD process, or an ALD process.

In example embodiments, at least one of the insulating layers 110 may have a thickness different from the others. For example, the first insulating layer 110a in contact with the substrate 100 may be thinner than the second to seventh insulating layers 110b to 110f. Further, the second, sixth, and seventh insulating layers 110b, 110f, and 110g may be thicker than the third to fifth insulating layers 110c, 110d, and 110e and/or sacrificial layers 112.

Figure 7:
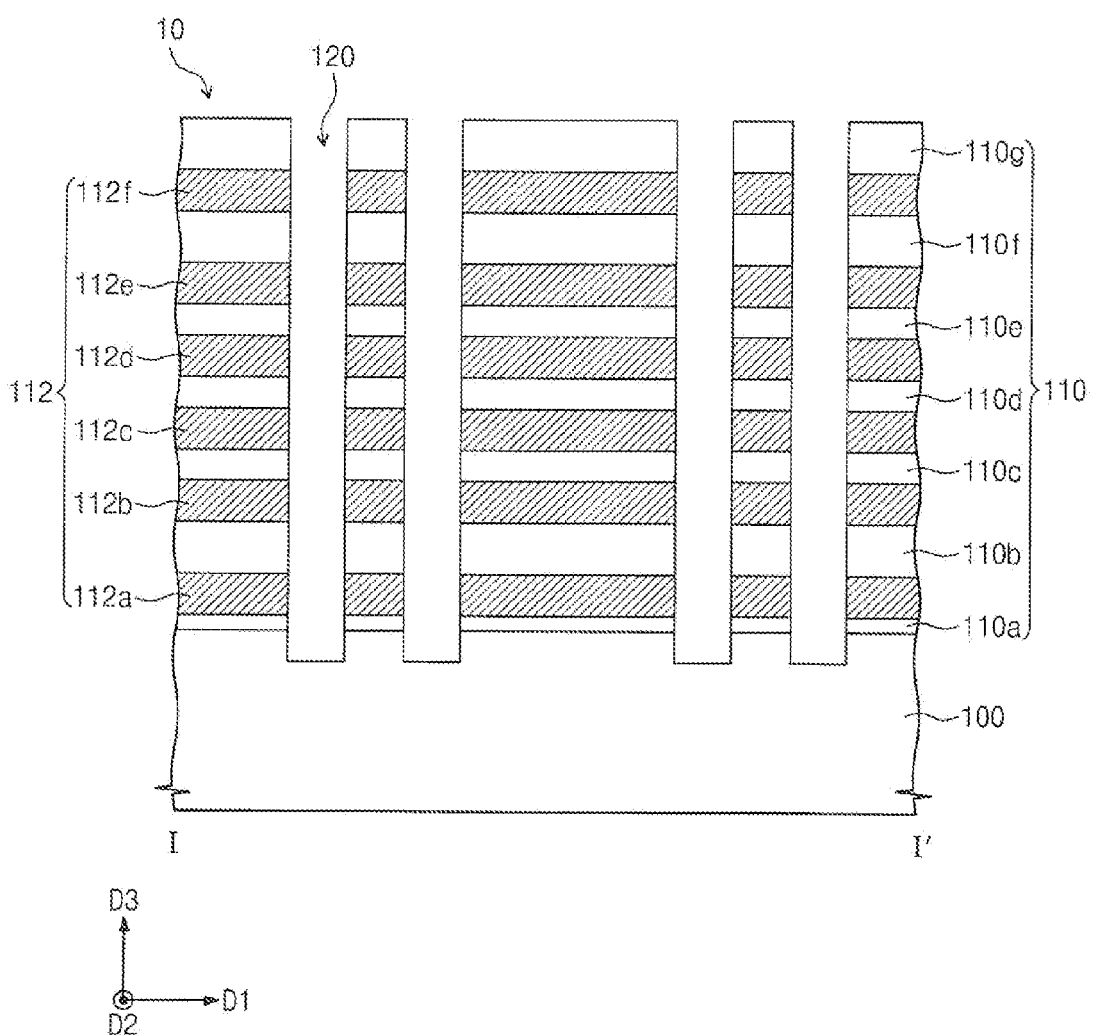

Referring to FIG. 7, channel holes 120 may be formed to penetrate the molding structure 10 and expose the substrate 100.

The channel holes 120 may be formed by anisotropically etching the molding structure 10. The channel holes 120 may be two-dimensionally arranged, as in the vertical channel structures 200 of FIG. 1. For example, the channel holes 120 may be disposed to form a plurality of groups, which may be separated from each other in a first direction D1, and which include four columns parallel to a second direction D2. Here, a column may include a plurality of the channel holes 120 arranged in the second direction D2. In certain embodiments, a group of the channel holes 120 may include N columns, where N is an integer that is different from four. When the channel holes 120 are formed, the substrate 100 may be over-etched or recessed.

Figure 8:
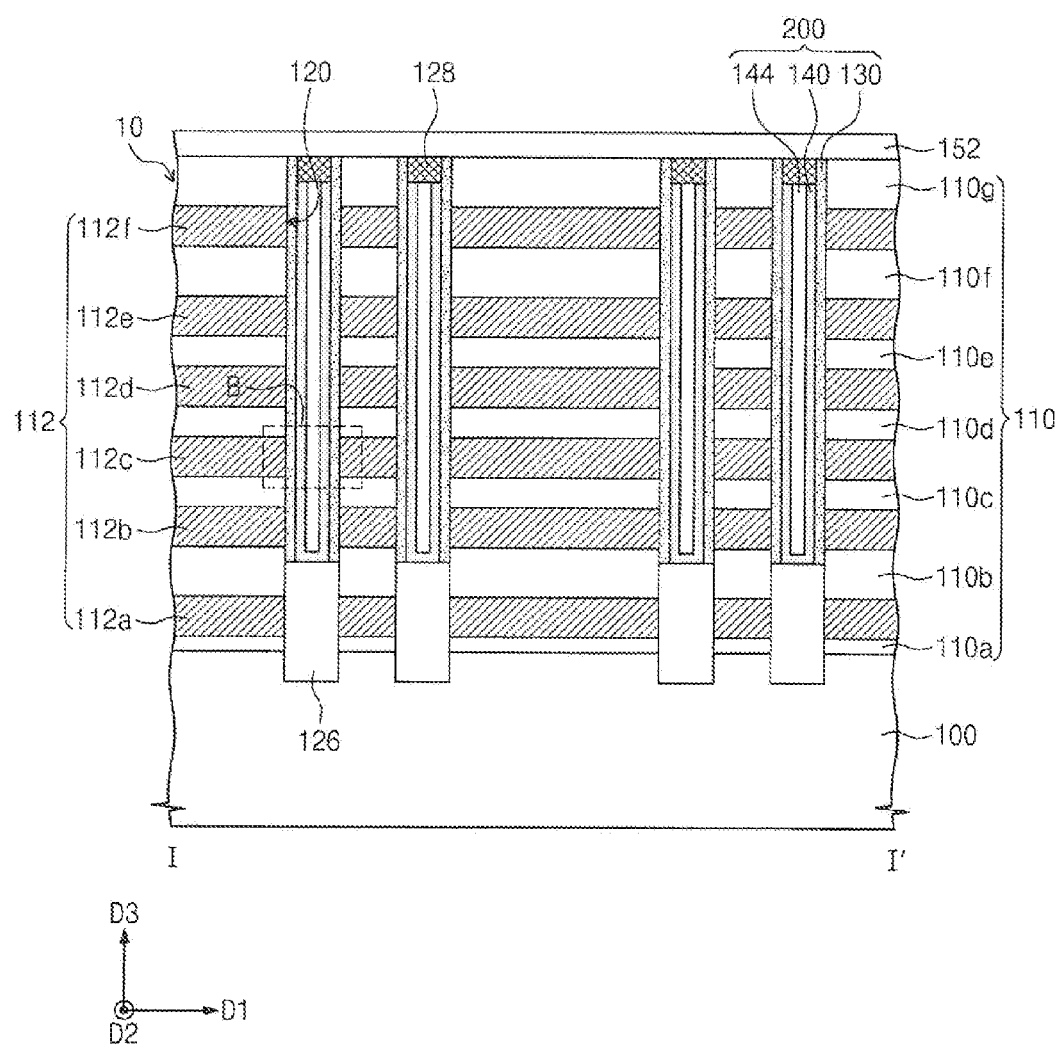
Figure 9:
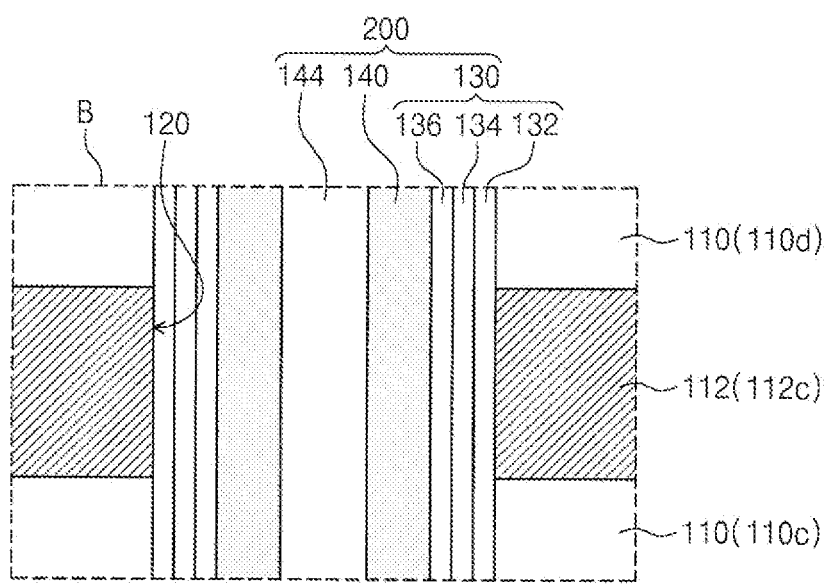
FIG. 9 is an enlarged view of portion B of FIG. 8.

Referring to FIGS. 8 and 9, vertical channel structures 200 may be formed on the substrate 100 to penetrate the molding structure 10 and extend in a third direction D3 perpendicular to a top surface of the substrate 100. The vertical channel structures 200 may fill the channel holes 120, respectively, and may be partially inserted into the substrate 100. The vertical channel structures 200 may include a semiconductor pattern 126, a data storage pattern 130, a vertical channel pattern 140, and an insulating gap-filling pattern 144.

The semiconductor patterns 126 may include a lower portion filling the recessed portion of the substrate 100 and a pillar-shaped upper portion that protrudes upwardly from the substrate 100. For example, the lower portion of the semiconductor pattern 126 may fill a lower portion of the channel hole 120. As an example, in the semiconductor pattern 126, the upper portion may protrude upwardly from the substrate 100, thereby being in contact with side surfaces of the first insulating layer 110a and the first sacrificial layer 112a and a portion of a side surface of the second insulating layer 110b. The semiconductor pattern 126 may have a top surface that is lower than that of the second insulating layer 110b. The semiconductor pattern 126 may include, for example, silicon (Si), germanium (Ge), silicon-germanium (SiGe), III-V semiconductor compounds, and/or II-VI semiconductor compounds. The semiconductor pattern 126 may be formed by a selective epitaxial growth (SEG) process. The semiconductor pattern 126 may be doped to have the same conductivity type as the substrate 100. For example, the semiconductor pattern 126 may be in-situ doped with impurities during the SEG process. In some embodiments, an ion implantation process may be further performed to dope the semiconductor pattern 126 with impurities.

Thereafter, the data storage pattern 130, the vertical channel pattern 140, and the insulating gap-filling pattern 144 may be formed to penetrate the molding structure 10. For example, the data storage pattern 130, the vertical channel pattern 140, and the insulating gap-filling pattern 144 may be formed on the semiconductor pattern 126.

The data storage pattern 130 may cover inner side surfaces of the channel holes 120. For example, the data storage pattern 130 having a spacer-like structure may be formed on the inner side surfaces of the channel holes 120. As an example, the data storage pattern 130 may be shaped like a hollow cylinder with an open top and bottom. The data storage pattern 130 may be in contact with the insulating and sacrificial layers 110 and 112 of the molding structure 10. The data storage pattern 130 may include a layer in which data can be stored. For example, the data storage pattern 130 may include a layer allowing for a change of stored data using the Fowler-Nordheim (FN) tunneling effect, but example embodiments of the inventive concepts are not limited thereto. In certain embodiments, the data storage pattern 130 may include a thin film (for example, as in a phase changeable memory device or a variable resistance memory device), whose data can be changed using other writing principles. The data storage pattern 130 may include a plurality of layers.

As shown in FIG. 9, the data storage pattern 130 may include, for example, the first blocking insulating layer 132, the charge storing layer 134, and the tunnel insulating layer 136. The first blocking insulating layer 132, the charge storing layer 134, and the tunnel insulating layer 136 may be sequentially formed on inner side surfaces of the channel holes 120. The first blocking insulating layer 132 may include a silicon oxide layer and/or a high-k dielectric layer (e.g., aluminum oxide layer or hafnium oxide layer). The first blocking insulating layer 132 may have a single- or multi-layered structure. In example embodiments, the first blocking insulating layer 132 may be a single silicon oxide layer. In other embodiments, the first blocking insulating layer 132 may comprise a plurality of layers including a silicon oxide layer, an aluminum oxide layer, and/or a hafnium oxide layer.

The charge storing layer 134 may be a trap insulating layer or an insulating layer with conductive nano dots. The trap insulating layer may include, for example, a silicon nitride layer. The first blocking insulating layer 132 and the charge storing layer 134 may be formed using a PE-CVD process or an ALD process.

The tunnel insulating layer 136 may be in contact with the vertical channel pattern 140. The tunnel insulating layer 136 may be, for example, a silicon oxide layer. The tunnel insulating layer 136 may be formed using a PE-CVD process, an ALD process, or a thermal oxidation process.

The vertical channel pattern 140 may be connected to the semiconductor pattern 126 and may be in contact with the data storage pattern 130. For example, the vertical channel pattern 140 may conformally cover the inner side surface of the channel holes 120. In other words, the vertical channel pattern 140 may be a vertically-elongated liner structure (for example, extending along the third direction D3). The vertical channel pattern 140 may be shaped like a vertically-elongated hollow cylinder with an open top. In certain embodiments, the vertical channel pattern 140 may be shaped like a hollow cylindrical pipe with an open top and open bottom. In other example embodiments, the vertical channel pattern 140 may be shaped like a solid circular pillar, and in this case, the insulating gap-filling pattern 144 may not be provided in the channel holes 120. The vertical channel pattern 140 may include a semiconductor material. Further, the vertical channel pattern 140 may have a polycrystalline, amorphous, or single crystalline structure. The vertical channel pattern 140 may include, for example, silicon (Si), germanium (Ge), silicon-germanium (SiGe), III-V semiconductor compounds, and/or II-VI semiconductor compounds. The vertical channel pattern 140 may be formed of an undoped or intrinsic semiconductor material or a doped semiconductor material having the same conductivity type as the substrate 100. The vertical channel pattern 140 may be formed using an ALD process, a CVD process, or an epitaxial growth process.

The insulating gap-filling pattern 144 may fill an inner space of the channel hole 120 provided with the vertical channel pattern 140. The insulating gap-filling pattern 144 may include a silicon oxide layer and/or a silicon nitride layer. A hydrogen annealing process may be further performed to cure lattice defects of the vertical channel pattern 140, before or after the formation of the insulating gap-filling pattern 144.

Conductive pads 128 may be formed on the vertical channel structures 200, respectively. For example, the formation of the conductive pads 128 may include recessing top surfaces of the vertical channel structures 200 (for example, of the vertical channel patterns 140 and the insulating gap-filling pattern 144) and forming a conductive material in the recessed regions. The conductive pads 128 may include, for example, poly silicon or amorphous silicon. In certain embodiments, the conductive pads 128 may be formed by injecting impurities into top portions of the vertical channel patterns 140.

A capping insulating layer 152 may be formed on the top insulating layer (for example, the seventh insulating layer 110g) to cover the conductive pads 128. The capping insulating layer 152 may be formed of or include, for example, a silicon oxide layer.

Figure 10:
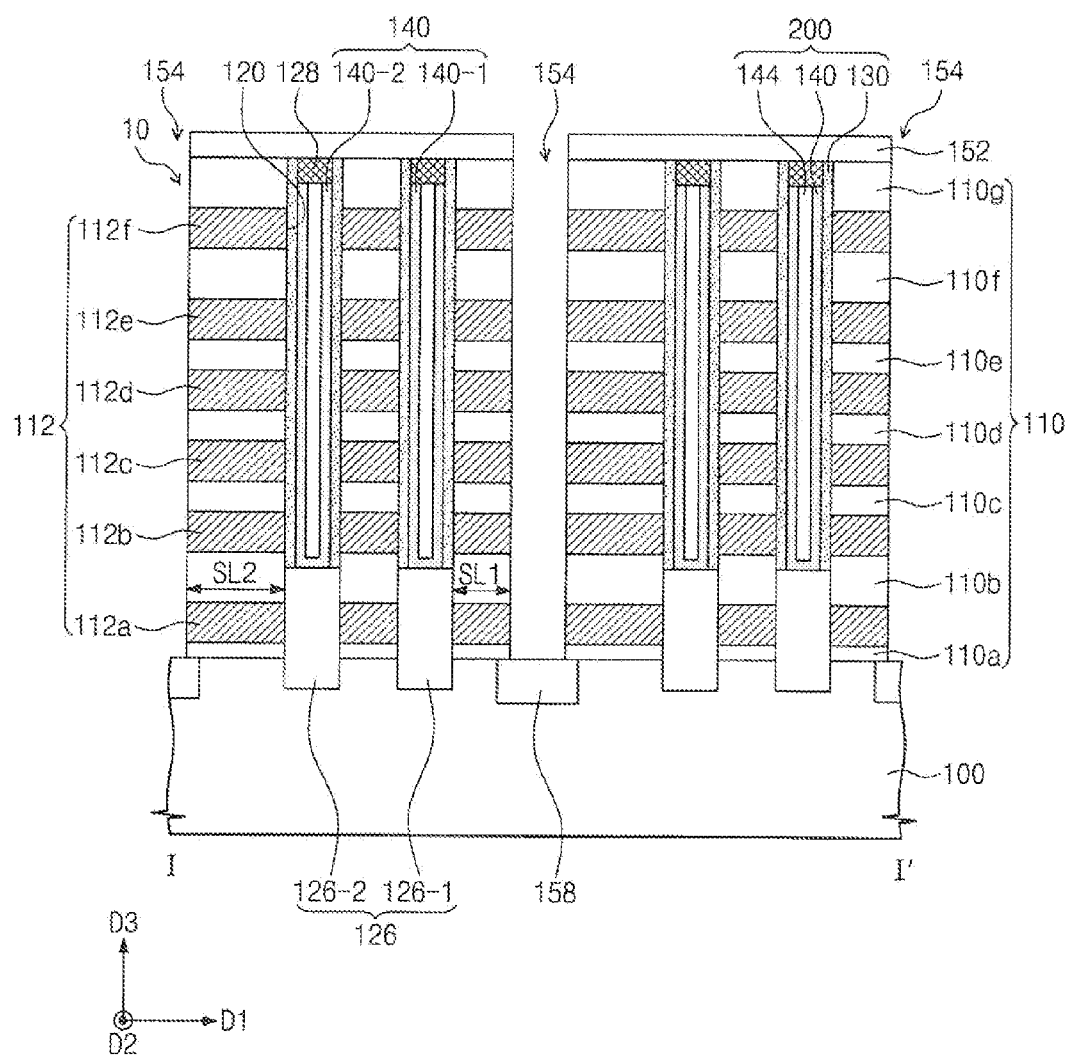

Referring to FIG. 10, the capping layer 152 and the molding structure 10 may be patterned to form a trench 154 exposing the substrate 100 between the vertical channel structures 200. Then, a common source region 158 may be formed in a portion of the substrate 100 exposed by the trench 154. For example, the trench 154 may be formed by anisotropically etching the capping layer 152 and the molding structure 10. For example, as shown in FIG. 1, the trench 154 may be formed to define vertical channel groups, which may be spaced apart from each other in the first direction D1, and which may include four columns of the vertical channel structures 200 parallel to the second direction D2. In certain embodiments, the trench 154 may be formed so that each vertical channel group has N columns of the vertical channel structures 200, where N is an integer that is different from four. The trench 154 may extend parallel to the second direction D2. As a result of the formation of the trench 154, the semiconductor patterns 126 may be classified into a first semiconductor pattern 126-1 and a second semiconductor pattern 126-2. The first semiconductor pattern 126-1 may be a pattern that is disposed horizontally adjacent the trench 154 in the first direction D1 and the second semiconductor pattern 126-2 may be a pattern disposed horizontally apart from the trench 154 in the first direction D1. A separation distance SL1 in the first direction D1 between the first semiconductor pattern 126-1 and the trench 154 may be shorter than a separation distance SL2 in the first direction D1 between the second semiconductor pattern 126-2 and an adjacent trench 154. The vertical channel patterns 140 may be classified into two types: a first vertical channel pattern 140-1 that is connected to the first semiconductor pattern 126-1 and a second vertical channel pattern 140-2 that is connected to the second semiconductor pattern 126-2.

The common source region 158 may be formed by injecting n-type impurities, such as arsenic (As) or phosphorus (P), into the substrate 100 exposed by the trench 154.

Figure 11:
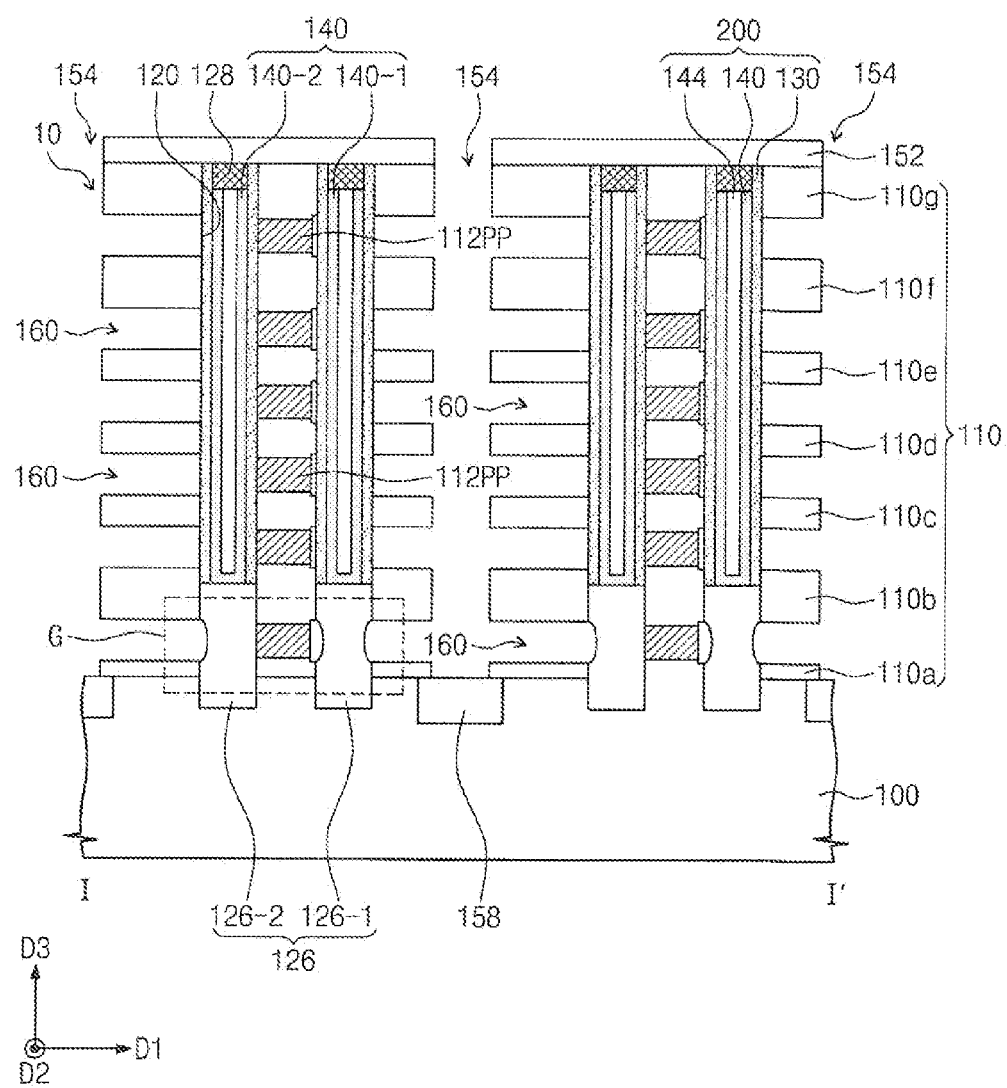
Figure 12:
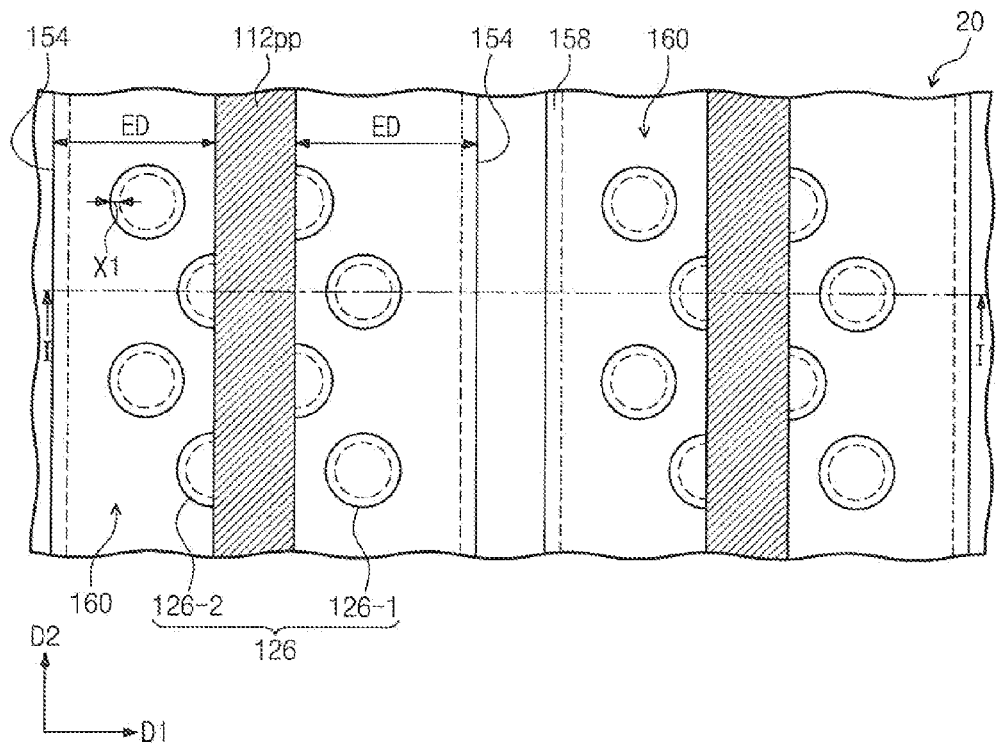
FIG. 12 is a schematic plan view taken at a level of region G of FIG. 11.
Figure 13:
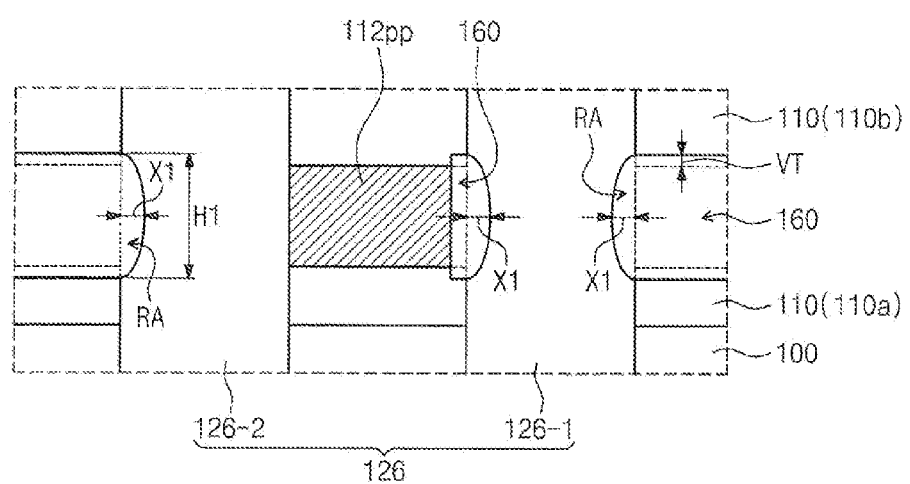
FIG. 13 is an enlarged view of region G of FIG. 11.

Referring to FIGS. 11 through 13, first opening regions 160 may be formed in the molding structure 10. For example, the sacrificial layers 112 exposed by the trench 154 may be partially removed to form the first opening regions 160 between the insulating layers 110. In example embodiments, sacrificial layer patterns 112PP may remain between the vertical channel structures 200. As an example, in the case where the sacrificial layers 112 are silicon nitride layers and the insulating layers 110 are silicon oxide layers, the first opening regions 160 may be formed by isotropically etching the partial removal of the sacrificial layers 112 using an etching solution containing phosphoric acid. Here, as shown in FIG. 12, the sacrificial layer patterns 112PP may be spaced apart from the trench 154 by a horizontal distance ED. The sacrificial layer patterns 112PP may be formed between the vertical channel structures 200, and thus, sidewalls of the vertical channel structures 200 that are not adjacent the trench 154 may be partially covered with the sacrificial layer patterns 112PP. In contrast, sidewalls of the vertical channel structures 200 that are adjacent the trench 154 may be completely exposed in the first and second direction D1 and D2 by the first opening regions 160. Further, the sidewalls of the vertical channel structures 200 that are not adjacent the trench 154 may be partially exposed by the first opening regions 160. For example, referring back to FIG. 1, the vertical channel structures 200 adjacent the trench 154 may be first and fourth vertical structures 200a and 200d along the first and fourth columns 1 and 4, and the vertical channel structures 200 not adjacent the trench 154 may be the second and third vertical structures 200b and 200c along the second and third columns 2 and 3.

As shown in FIG. 13, a sidewall of the first semiconductor pattern 126-1 may be completely exposed by the first opening regions 160 and a sidewall of the second semiconductor pattern 126-2 may be partially exposed by the first opening regions 160. The sidewalls of the semiconductor patterns 126 exposed by the first opening regions 160 may be etched to have a laterally recessed profile. Here, the insulating layers 110 may also be etched to have a vertically reduced thickness. In other words, the sidewalls of the semiconductor patterns 126 and the insulating layers 110 may be partially etched by the isotropic etching process for forming the first opening regions 160. In certain embodiments, the isotropic etching process may be performed via wet etching using an etching solution containing SCI or ammonia. The insulating layers 110 may be removed by, for example, a first etching thickness VT. The etched sidewalls of the semiconductor patterns 126 may have a rounded profile. On the sidewalls of the first semiconductor pattern 126-1 and portions of the sidewalls of the second semiconductor pattern 126-2, recess regions RA may be formed to have a maximum etching depth X1 and a first height H1.

Figure 14:
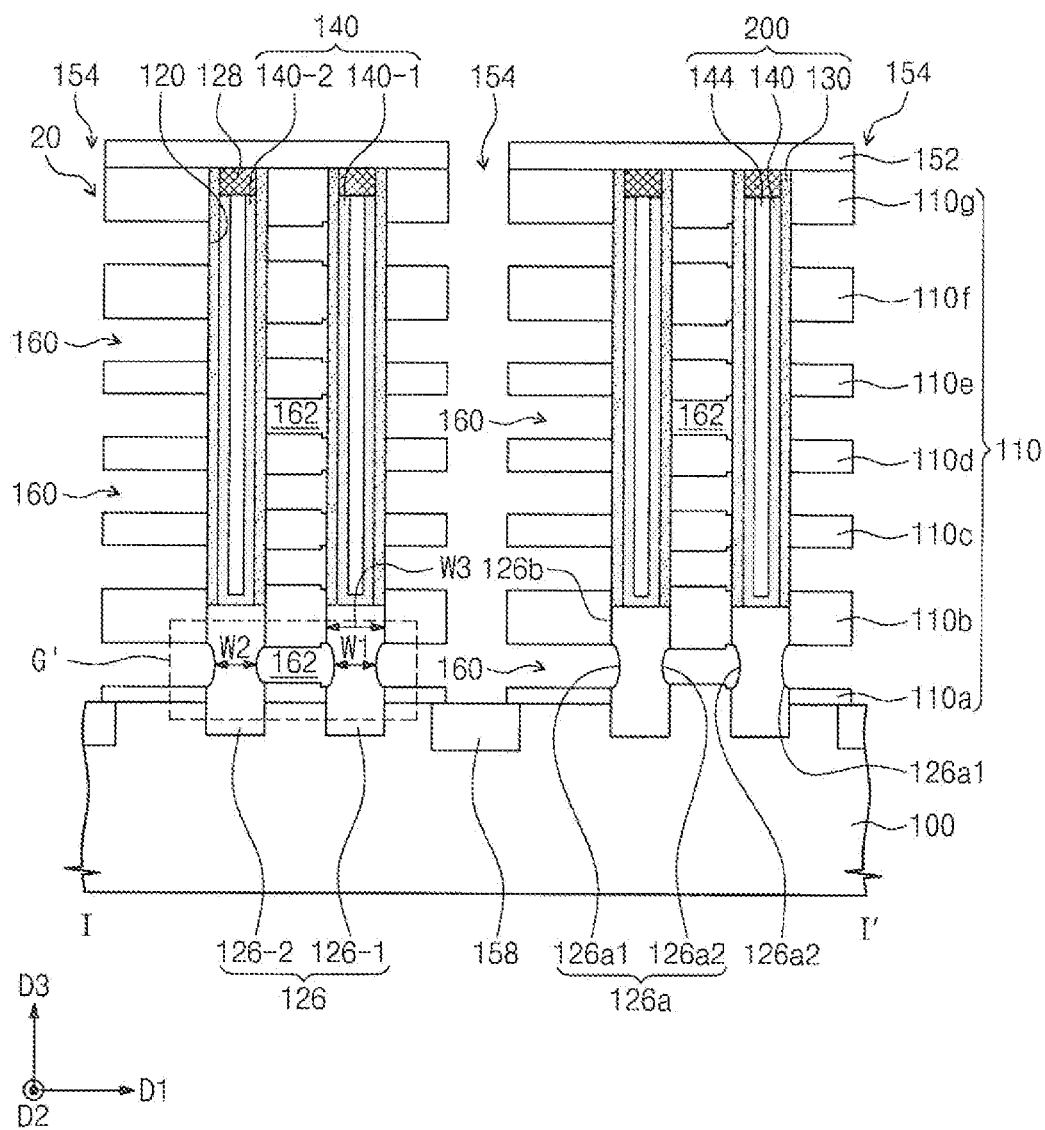
Figure 15:
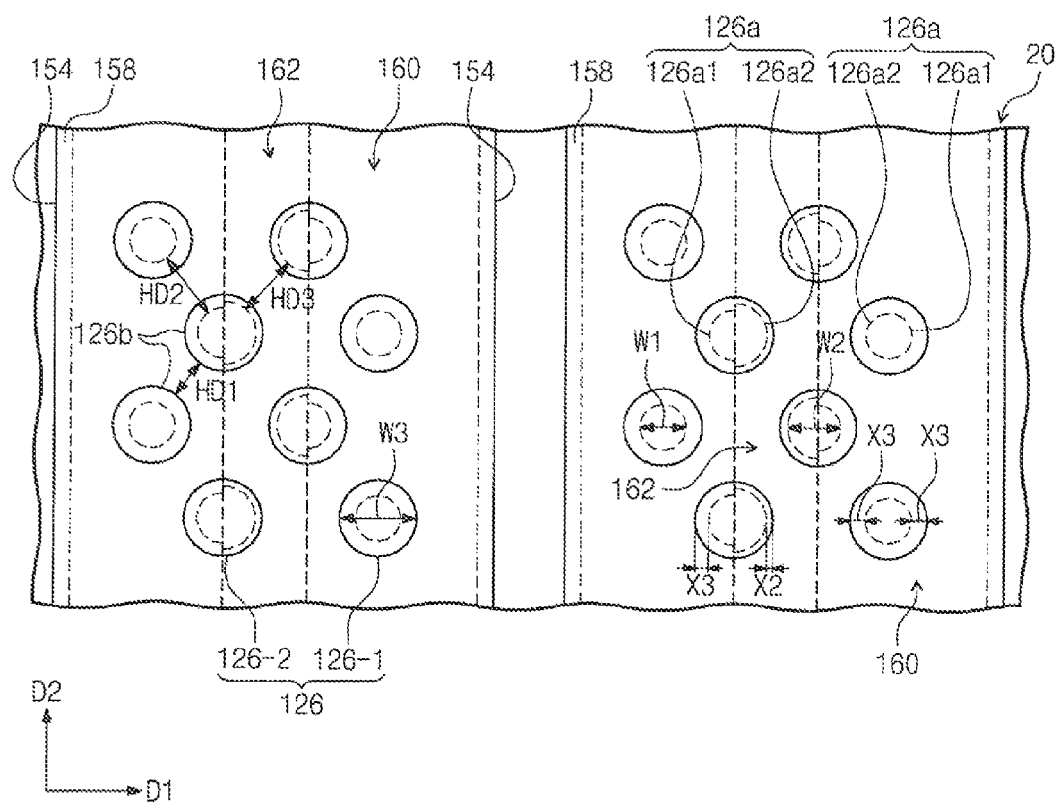
FIG. 15 is a schematic plan view taken at a level of region G' of FIG. 14.
Figure 16:
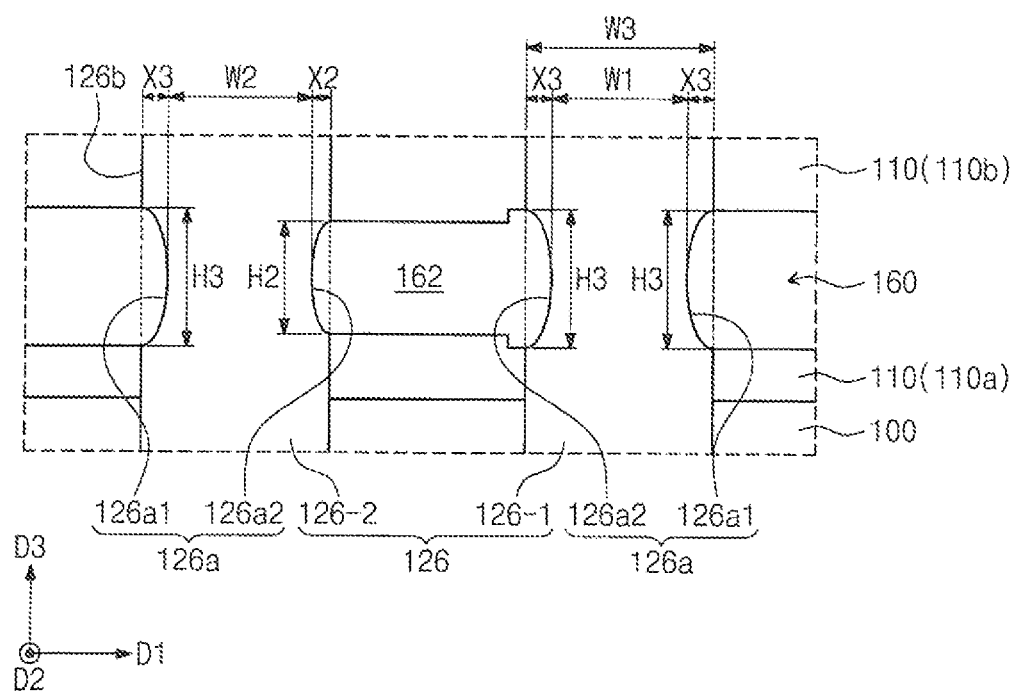
FIG. 16 is an enlarged view of region G' of FIG. 14.

Referring to FIGS. 14 through 16, the sacrificial layer patterns 112PP may be removed to form second opening regions 162. The removal of the sacrificial layer patterns 112PP for the formation of the second opening regions 162 may be performed in substantially the same manner as the process of etching sacrificial layer patterns 112 (i.e., to form the first opening regions 160). For example, the sacrificial layer patterns 112PP may be isotropically removed using an etching solution containing phosphoric acid. The first and second opening regions 160 and 162 may be formed to extend in the first and second direction D1 and D2 and thereby to completely expose the sidewalls of the vertical channel structures 200 at the levels of the first and second opening regions 160 and 162. For example, the first and second opening regions 160 and 162 may partially expose sidewalls of the first blocking insulating layer 132 (e.g., of FIG. 9) of the data storage pattern 130 of the vertical channel structures 200 and the sidewalls of the semiconductor patterns 126.

The formation of the second opening regions 162 may be performed to recess the sidewall of the second semiconductor pattern 126-2 exposed thereby. For example, the sidewall of the second semiconductor pattern 126-2 exposed by the second opening regions 162 may be isotropically etched to have a maximum recess depth X2. Here, the isotropic etching may be performed by a wet etching using an etching solution containing SCI or ammonia. In example embodiments, during the formation of the second opening regions 162, the etched sidewalls of the first and second semiconductor patterns 126-1 and 126-2 exposed by the first opening regions 160 may be further recessed by the maximum recess depth X2. For portions of the sidewalls of the first and second semiconductor patterns 126-1 and 126-2 which were previously recessed by a maximum recess depth of X1, this operation may result in a greater maximum recess depth of X3. Accordingly, the semiconductor patterns 126 may be formed to have a first recessed sidewall 126a1 and a second recessed sidewall 126a2, as shown in FIG. 16. The first and second recessed sidewalls 126a1 and 126a2 of the semiconductor patterns 126 may have rounded profiles, when viewed in a plan view.

Referring to FIG. 16, the first and second recessed sidewalls 126a1 and 126a2 of the first semiconductor pattern 126-1 may have substantially the same maximum recess depth X3. The first recessed sidewall 126a1 of the second semiconductor pattern 126-2 may have the maximum recess depth X3, which is substantially equal to that of the first and second recessed sidewalls 126a1 and 126a2 of the first semiconductor pattern 126-1. The second recessed sidewall 126a2 of the second semiconductor pattern 126-2 may have a maximum recess depth X2, which is smaller than that of the first recessed sidewall 126a1. For example, a difference between the maximum recess depths X2 and X3 of the first and second recessed sidewalls 126a1 and 126a2 of the second semiconductor pattern 126-2 may range from about 10 Å to about 60 Å.

The first semiconductor pattern 126-1 may have a minimum width W1 that is smaller than a minimum width W2 of the second semiconductor pattern 126-2. The minimum width W1 of the first semiconductor pattern 126-1 may be a distance between the first and second recessed sidewalls 126a1 and 126a2, which may be recessed in the maximum recess depth X3. The minimum width W2 of the second semiconductor pattern 126-2 may be a distance between the first and second recessed sidewalls 126a1 and 126a2, which may be recessed in the maximum recess depths X3 and X2, respectively.

The first and second semiconductor patterns 126-1 and 126-2 may have the maximum width at a top portion thereof (e.g., between upper sidewalls 126b thereof). The upper sidewalls 126b of the first and second semiconductor patterns 126-1 and 126-2 may be in contact with the second insulating layer 110b. The first and second recessed sidewalls 126a1 and 126a2 of the first semiconductor pattern 126-1 may have substantially the same height H3. The first recessed sidewall 126a1 of the second semiconductor pattern 126-2 may have substantially the same height (i.e., H3) as that of the first and second recessed sidewalls 126a1 and 126a2 of the first semiconductor pattern 126-1. The second recessed sidewall 126a2 of the second semiconductor pattern 126-2 may have a height H2, which is smaller than the height 113 of the first recessed sidewall 126a1.

In sum, as shown in FIG. 15, the upper sidewalls 126b of the first and second semiconductor patterns 126-1 and 126-2 adjacent each other in the second direction D2 may be spaced apart from each other by at least a first distance HD1, and the recessed sidewalls 126a1 and 126a2 of the semiconductor patterns 126-1 and 126-2 may be spaced apart from each other by a second distance HD2 larger than the first distance HD1. The recessed sidewalls 126a of the second semiconductor patterns 126-2 adjacent each other in the second direction D2 may be spaced apart from each other by at least a third distance HD3. In other words, between the first and second semiconductor patterns 126-1 and 126-2 that are adjacent each other in the second direction D2, the first opening region 160 may be formed to have a width, which may be the same as the second distance HD2 or may be larger than at least the first distance HD1. The second opening region 162 may be formed to have a width, which is the same as at least the third distance HD3, between the recessed sidewalls 126a of the second semiconductor patterns 126-2 adjacent each other in the second direction D2. Here, the second distance HD2 may be larger than the third distance HD3, but example embodiments of the inventive concepts are not limited thereto. For example, in certain embodiments, the second distance HD2 may be substantially equal to the third distance HD3.

When the semiconductor patterns 126 are recessed, the insulating layers 10 exposed by the first and second opening regions 160 and 162 may also be partially etched. However, in certain embodiments, the insulating layers 110 may not be etched during the process of recessing the semiconductor patterns 126. In the case where the insulating layers 110 are partially etched, a thickness of the insulating layers 110 may be larger between the vertical channel structures 200 than near the trench 154. That is, the first and second opening regions 160 and 162 can be formed to have an increased vertical width.

Figure 17:
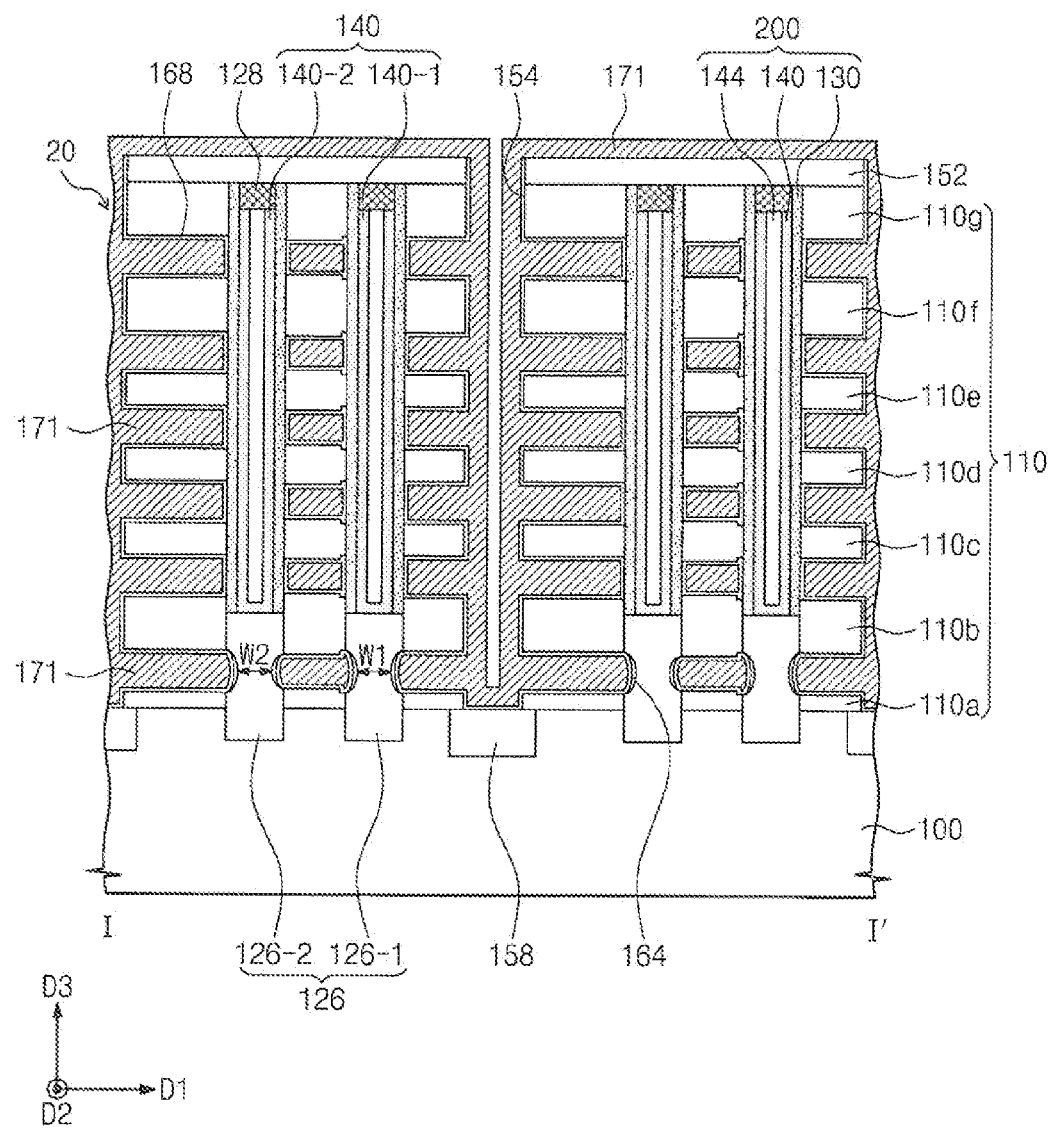

Referring to FIG. 17, a gate oxide layer 164 may be formed on the recessed sidewalls 126a of the semiconductor patterns 126. For example, the gate oxide layer 164 may be formed using a thermal oxidation process. The gate oxide layer 164 may serve as a gate dielectric layer of the ground selection transistor.

A second blocking insulating layer 168 and a gate conductive layer 171 may be formed to fill the first and second opening regions 160 and 162. The second blocking insulating layer 168 may conformally cover inner surfaces of the first and second opening regions 160. For example, the second blocking insulating layer 168 may be in contact with top and bottom surfaces of the insulating layers 110. The second blocking insulating layer 168 may also be in contact with the sidewalls of the vertical channel structures 200 exposed by the first and second opening regions 160 and 162. For example, the second blocking insulating layer 168 may be in contact with the first blocking insulating layer 132 (e.g., of FIG. 9). Further, the second blocking insulating layer 168 may also be in contact with the gate oxide layer 164 formed on the semiconductor patterns 126. The second blocking insulating layer 168 may include high-k dielectric materials (e.g., aluminum oxide and/or hafnium oxide). In certain embodiments, the second blocking insulating layer 168 may be omitted.

The gate conductive layer 171 may fill the remaining spaces of the first and second opening regions 160 and 162 with the second blocking insulating layer 168. The gate conductive layer 171 may be formed using a CVD or ALD process. The deposition process may be performed in such a way that the first and second opening regions 160 and 162 horizontally extending from the trench 154 can be filled with the gate conductive layer 171. As described with reference to FIG. 15, the first opening regions 160 may have an increased width (e.g., equal to the second distance HD2) between the first and second semiconductor patterns 126-1 and 126-2 that are adjacent each other in the second direction D2, and thus, it may be possible to easily deposit the gate conductive layer 171 in the second opening region 162. Accordingly, the first and second opening regions 160 and 162 can be filled with the gate conductive layer 171 without, or with reduced occurrence of, a process failure, such as occurrence of a void.

The gate conductive layer 171 may include metal. For example, the gate conductive layer 171 may include a metal layer, a metal silicide layer, and/or a metal nitride layer. Here, the metal layer may include, for example, nickel, cobalt, platinum, titanium, tantalum, and/or tungsten, and the metal silicide layer may include, for example, nickel silicide, cobalt silicide, platinum silicide, titanium silicide, tantalum silicide, and/or tungsten silicide. The metal nitride layer may include, for example, titanium nitride, tungsten nitride, and/or tantalum nitride.

Figure 18:
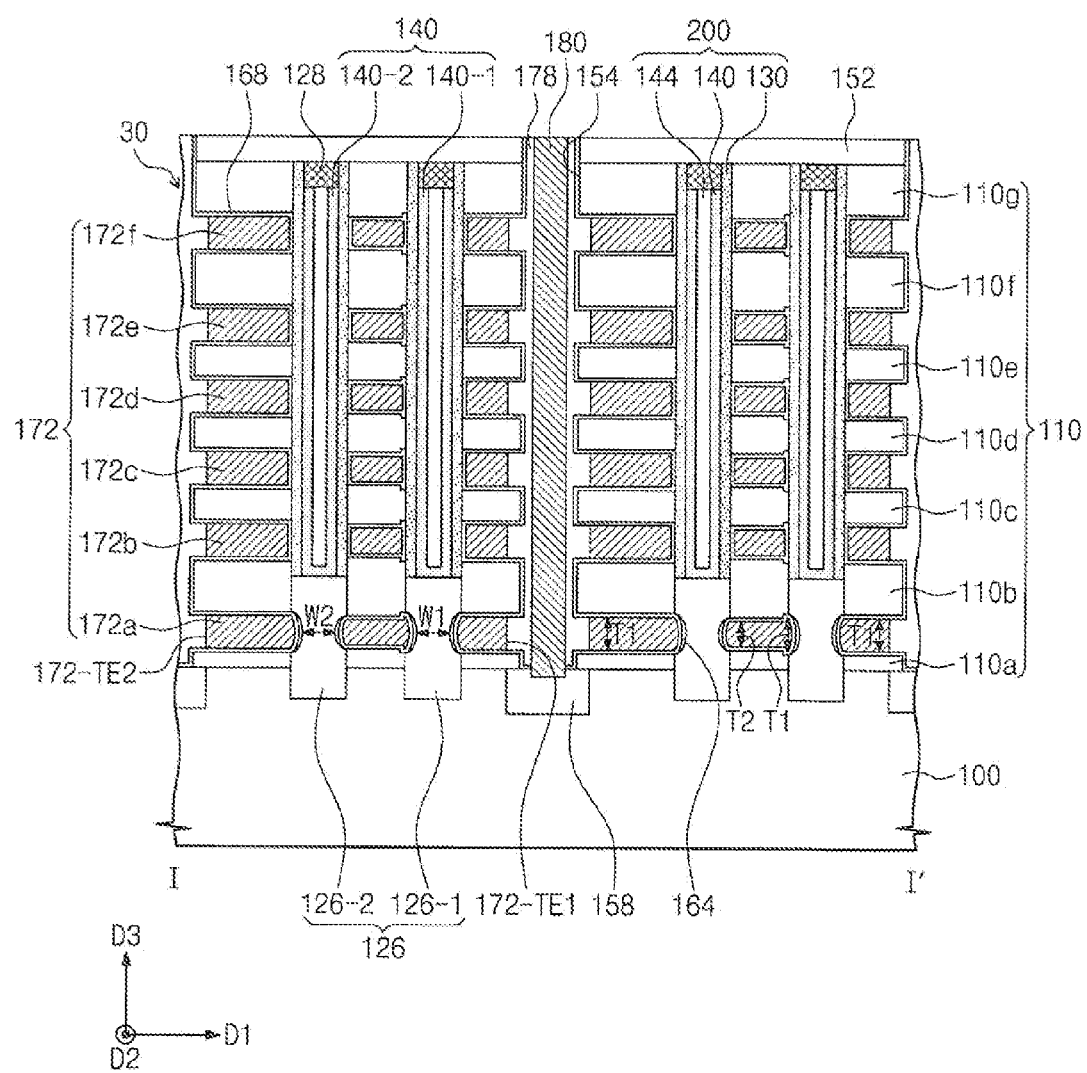

Referring to FIG. 18, gate electrodes 172, an insulating separation layer 178, and a common source plug 180 may be formed. For example, the gate electrodes 172 may be formed by isotropically etching the gate conductive layer 171. The gate electrodes 172 may be separated from each other by the insulating layers 110 in the third direction D3 and by the trench 154 in the first direction D1. As an example, the gate electrodes 172 may include first to sixth gate electrodes 172a, 172b, 172c, 172d, 172e, and 172f, which may be vertically separated from each other. When viewed in a sectional view, the gate electrodes 172 may have first and second end portions 172-TE1 and 172-TE2, which may be positioned adjacent the trench 154 and may be defined by the isotropic etching process. A thickness of the gate electrodes 172 may be changed with a position in the first direction D1. For example, the gate electrodes 172 may have a first thickness T1 at a region adjacent the end portions 172-TE1 and 172-TE2 of the gate electrodes 172 and a second thickness 12 at a region between the vertical channel structures 200. In the gate electrodes 172, a portion positioned between the vertical channel structures 200 may have the first thickness T1. Here, the first thickness T1 may be greater than the second thickness T2.

As a result of the formation of the gate electrodes 172, stacks 30 may be formed on the substrate 100. The stacks 30 may include the insulating layers 110 and the gate electrodes 172, which may be alternately and repeatedly stacked in the third direction D3. In example embodiments, the stacks 30 may include first to sixth gate electrodes 172a, 172b, 172c, 172d, 172e, and 172f and first to seventh insulating layers 110a, 110b, 110c, 110d, 110e, 110f, and 100g, which may be alternately stacked on the substrate 100. The stacks 30 may be separated from each other in the first direction D1 by the trench 154.

The insulating separation layer 178 may be formed to cover an inner side surface of the trench 154 and thereby have a liner shape. The insulating separation layer 178 may protect the end portions 172-TE1 and 172-TE2 of the gate electrodes 172. The insulating separation layer 178 may include a nitride layer, an oxide layer, and/or an oxynitride layer.

The common source plug 180 may be formed to fill the remaining space of the trench 154 with the insulating separation layer 178. The common source plug 180 may be coupled to the common source region 158. The common source plug 180 may extend parallel to the second direction D2 and have a line-shaped structure. In certain embodiments, a plurality of common source plugs 180 may be spaced apart from each other in the trench 154. That is, the plurality of common source plugs 180 may be arranged along the second direction D2. The common source plug 180 may include a conductive material. For example, the common source plug 180 may include poly silicon and/or metals (e.g., tungsten or copper).

Figure 19:
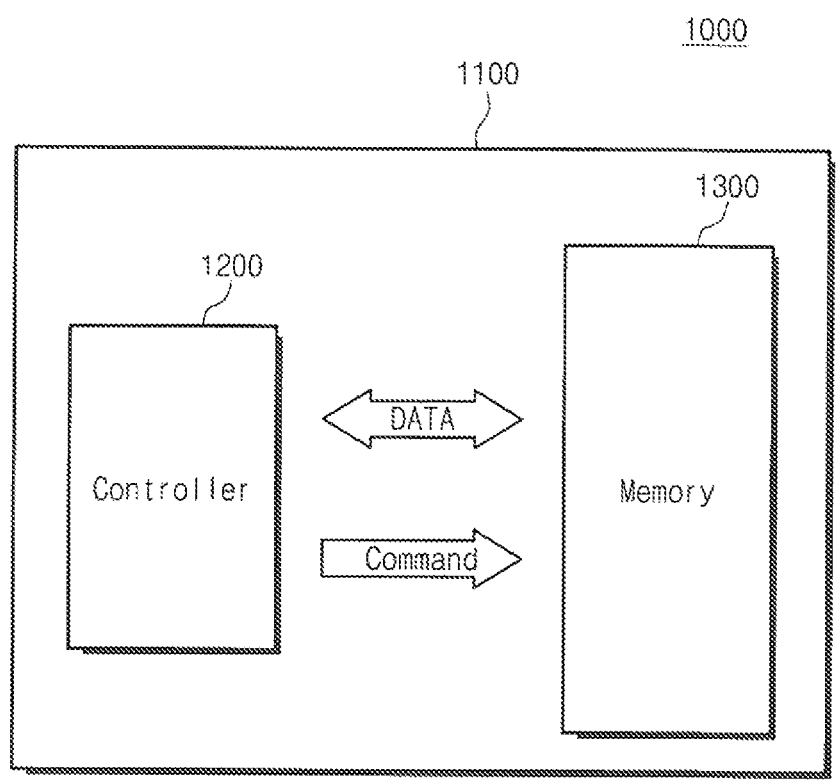
FIG. 19 is a schematic block diagram illustrating example semiconductor memory systems including semiconductor memory devices according to example embodiments of the inventive concepts.

FIG. 19 is a schematic block diagram illustrating an example of semiconductor memory systems including semiconductor memory devices according to example embodiments of the inventive concepts.

Referring to FIG. 19, a memory system 1000 may be configured to store data in at least one semiconductor device. For example, the memory system 1000 may be provided in the form of a memory card or a solid state drive (SSD). The memory system 1000 may include a controller 1200 and a memory device 1300 provided in a housing 1100. The memory system 1000 may be configured to allow electric signals to be exchanged between the controller 1200 and the memory device 1300. For example, an operation of exchanging data between the memory device 1300 and the controller 1200 may be executed in response to commands from the controller 1200. In other words, the memory system 1000 may be configured to store data in the memory device 1300 or send data stored in the memory device 1300 to the outside thereof. The memory device 1300 may include one of the semiconductor memory devices according to example embodiments of the inventive concepts.

Figure 20:
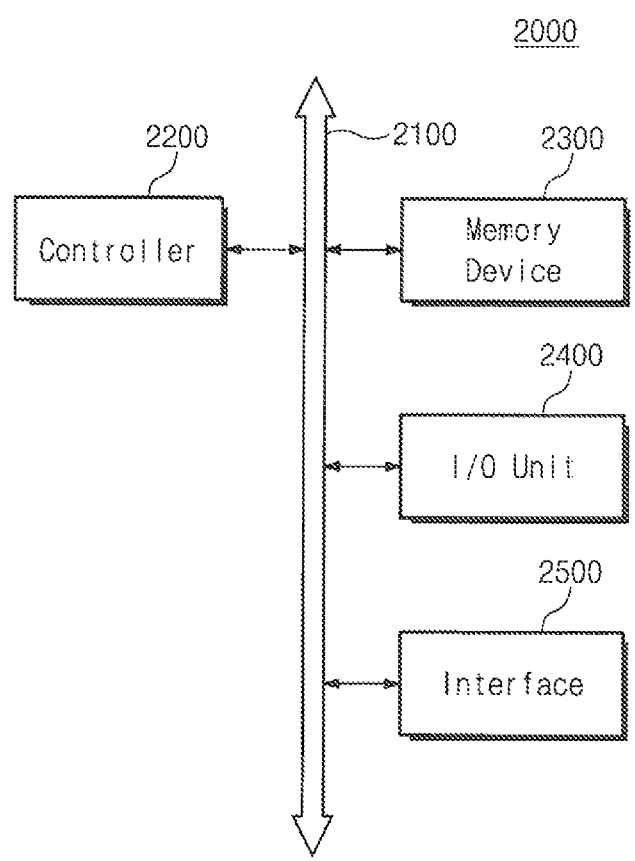
FIG. 20 is a schematic block diagram illustrating example electronic systems including semiconductor memory devices according to example embodiments of the inventive concepts.

FIG. 20 is a schematic block diagram illustrating an example of electronic systems including a semiconductor memory device according to example embodiments of the inventive concept.

Referring to FIG. 20, an electronic system 2000 may include a controller 2200, a memory device 2300, and an input-output unit 2400. The controller 2200, the memory device 2300, and the input-output unit 2400 may be electrically coupled or connected to each other via a bus 2100. The bus 2100 may correspond to a path through which electrical signals or data are transmitted. The controller 2200 may include a microprocessor, a digital signal processor, a microcontroller, or a logic device. The logic device may have a similar function to any one of the microprocessor, the digital signal processor and the microcontroller. The input-output unit 2400 may include a keypad, a keyboard, or a display device. The memory device 2300 may store data and/or commands executed by the controller 2200. The memory device 2300 may include a volatile memory device and/or a nonvolatile memory device. For example, the memory device 2300 may include a flash memory device. In some embodiments, the memory device 2300 may include a solid-state drive (SSD) including, for example, at least one flash memory device, and in this case, the electronic system 2000 may stably store a large capacity of data. In certain embodiments, the memory device 2300 may include semiconductor memory devices according to example embodiments of the inventive concepts. The electronic system 2000 may further include an interface unit 2500 for transmitting or receiving data to or from a communication network through a wireless or wired mechanism. For example, the interface 2500 may include an antenna for wireless communication and/or a transceiver for wired communication.

According to example embodiments of the inventive concepts, a plurality of stacks, which may be separated from each other in a first direction by a trench, may be formed on a substrate. Here, respective ones of the stacks may include insulating layers and gate electrodes alternately stacked on top of each other. Vertical channel structures, which include a semiconductor pattern connected to the substrate and a vertical channel pattern provided thereon, may penetrate respective ones of the stacks. The semiconductor patterns may have laterally recessed sidewalls. Here, one of the recessed sidewalls adjacent the trench in the first direction may have a recess depth greater than another recessed sidewall not adjacent the trench. This makes it possible to increase a distance between the recessed sidewalls of semiconductor patterns that are adjacent each other in a second direction crossing the first direction and thereby to form a gate electrode enclosing the semiconductor patterns with ease. Further, this makes it possible to realize highly integrated, highly reliable semiconductor memory devices.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor memory device, comprising:
    stacks separated from each other in a first direction by a trench, each of the stacks comprising insulating layers and gate electrodes alternately and repeatedly stacked on a substrate;
    first and second semiconductor patterns arranged along the first direction, each of the first and second semiconductor patterns being inserted in a lower portion of each of the stacks and being connected to the substrate;
    first and second vertical channel patterns in each of the stacks on the respective first and second semiconductor patterns; and
    a common source plug in the trench,
    wherein the first semiconductor pattern is closer to the trench than the second semiconductor pattern, and
    wherein a minimum width of the first semiconductor pattern is less than that of the second semiconductor pattern.

2. The device of claim 1, wherein each of the stacks comprises:
    a first gate electrode intersected with the first and second semiconductor patterns; and
    second gate electrodes vertically stacked on the first gate electrode to enclose the first and second vertical channel patterns.

3. The device of claim 2, wherein a data storage pattern is between the second gate electrodes and the first vertical channel pattern, and between the second gate electrodes and the second vertical channel pattern.

4. The device of claim 2, wherein the first gate electrode encloses sidewalls of the first and second semiconductor patterns, has end portions spaced apart from each other in the first direction, has a first thickness between the first and second semiconductor patterns, and has a second thickness at the end portions, and wherein the second thickness is larger than the first thickness.

5. The device of claim 1, wherein the first and second semiconductor patterns have recessed sidewalls, respectively.

6. The device of claim 5, wherein the minimum width of the first semiconductor pattern and the minimum width of the second semiconductor pattern are between the recessed sidewalls.

7. The device of claim 5, wherein the recessed sidewall of the second semiconductor pattern comprises a first recessed sidewall and a second recessed sidewall opposite to each other in the first direction, and
    a first maximum recess depth of the first recessed sidewall is different from a second maximum recess depth of the second recessed sidewall.

8. The device of claim 7, wherein a difference between the first maximum recess depth and the second maximum recess depth is from about 10 Å to about 60 Å.

9. The device of claim 5, wherein a maximum recess depth of the recessed sidewall of the first semiconductor pattern is substantially uniform in all directions parallel to a top surface of the substrate.

10. A semiconductor memory device, comprising:
    stacks separated from each other in a first direction by a trench, each of the stacks comprising insulating layers and gate electrodes alternately and repeatedly stacked on a substrate;
    semiconductor patterns arranged along the first direction, each of the semiconductor patterns being inserted in a lower portion of each of the stacks and being connected to the substrate;
    vertical channel patterns in each of the stacks on the respective semiconductor patterns; and
    a common source plug in the trench,
    wherein at least one of the semiconductor patterns has recessed sidewalls, which are opposite to each other in the first direction, and
    wherein the maximum recess depths of the recessed sidewalls are different from each other.

11. The device of claim 10, wherein the recessed sidewalls of the at least one of the semiconductor patterns comprise first and second recessed sidewalls, wherein the first recessed sidewall is closer to the trench than the second recessed sidewall, and
    a first maximum recess depth of the first recessed sidewall is greater than a second maximum recess depth of the second recessed sidewall.

12. The device of claim 11, wherein a difference between the first maximum recess depth and the second maximum recess depth is from about 10 Å to about 60 Å.

13. The device of claim 11, wherein a first height of the first recessed sidewall is greater than a second height of the second recessed sidewall.

14. The device of claim 11, wherein respective ones of the stacks comprise a first gate electrode intersected with the semiconductor patterns, and
    wherein the first gate electrode is thicker adjacent the first recessed sidewall than adjacent the second recessed sidewall.

15. The device of claim 10, wherein the semiconductor device further comprises a tunnel insulating layer, a charge storing layer, and a blocking insulating layer, which are between the vertical channel patterns and respective ones of the stacks.

16. A semiconductor memory device, comprising:
    a substrate having a first common source region and a second common source region in an upper surface thereof, the first and second common source regions spaced apart from each other in a first direction and extending in a second direction that is perpendicular to the first direction;
    a plurality of insulating layers and a plurality of gate electrodes alternately and repeatedly stacked on the upper surface of the substrate in between the first and second common source regions, the insulating layers and gate electrodes stacked in a third direction that is perpendicular to the first and second directions;

first and second semiconductor patterns that extend upwardly from the substrate, the first and second semiconductor patterns spaced apart from each other along the first direction; and first and second vertical channel patterns on the respective first and second semiconductor patterns, wherein a first portion of the lowermost of the gate electrodes that is between the first and second semiconductor patterns has a first thickness adjacent the first semiconductor pattern and a second thickness adjacent the second semiconductor pattern, where the first thickness exceeds the second thickness.

17. The semiconductor memory device of claim 16, wherein a first sidewall of the first semiconductor pattern includes a first recess and a first sidewall of the second semiconductor pattern that faces the first sidewall of the first semiconductor pattern includes a second recess, and wherein the lowermost of the gate electrodes extends into the first and second recesses.

18. The semiconductor memory device of claim 17, wherein a first distance between the first semiconductor pattern and the one of the first and second common source regions that is closest thereto is less than a second distance between the second semiconductor pattern and the one of the first and second common source regions that is closest thereto.

19. The semiconductor memory device of claim 17, wherein a second portion of the lowermost of the gate electrodes that is adjacent a second sidewall of the first semiconductor pattern that is opposite the first sidewall of the first semiconductor pattern has the first thickness, and a third portion of the lowermost of the gate electrodes that is adjacent a second sidewall of the second semiconductor pattern that is opposite the first sidewall of the second semiconductor pattern has the first thickness.

20. The semiconductor memory device of claim 17, wherein a first depth of the first recess is greater than a second depth of the second recess.

* * * * *